(12) United States Patent
Masuoka et al.

(10) Patent No.: US 9,825,097 B2
(45) Date of Patent: Nov. 21, 2017

(54) MEMORY DEVICE HAVING ELECTRICALLY INSULATED RESET GATE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 10 days.

(21) Appl. No.: 15/140,165

(22) Filed: Apr. 27, 2016

(65) Prior Publication Data

US 2016/0240586 A1 Aug. 18, 2016

Related U.S. Application Data

(63) Continuation of application No. PCT/JP2014/054270, filed on Feb. 24, 2014.

(51) Int. Cl.
*H01L 27/24* (2006.01)
*H01L 45/00* (2006.01)

(52) U.S. Cl.
CPC ...... *H01L 27/2454* (2013.01); *H01L 27/2463* (2013.01); *H01L 45/06* (2013.01); *H01L 45/128* (2013.01); *H01L 45/1233* (2013.01); *H01L 45/1253* (2013.01); *H01L 45/1286* (2013.01); *H01L 45/144* (2013.01); *H01L 45/1658* (2013.01); *H01L 45/1675* (2013.01)

(58) Field of Classification Search
CPC . H01L 27/2454; H01L 27/2463; H01L 45/06; H01L 45/1233; H01L 45/1253; H01L 45/128; H01L 45/1286; H01L 45/144; H01L 45/1658; H01L 45/1675

USPC ........ 257/225, 261, 296, 314, 324; 438/216, 438/266, 287

See application file for complete search history.

(56) References Cited

U.S. PATENT DOCUMENTS

2011/0062523 A1* 3/2011 Masuoka .......... H01L 21/82381
257/368

FOREIGN PATENT DOCUMENTS

| JP | 2009-123847 A | 6/2009 |
|----|---------------|--------|
| JP | 2010-225218 A | 10/2010 |
| JP | 2011-199017 A | 10/2011 |
| JP | 2012-186424 A | 9/2012 |

(Continued)

OTHER PUBLICATIONS

English language translation of International Preliminary Report on Patentability in corresponding International Application No. PCT/JP2014/054270, dated Aug. 25, 2016, 9 pages.

(Continued)

*Primary Examiner* — Shahed Ahmed
(74) *Attorney, Agent, or Firm* — Brinks Gilson & Lione

(57) ABSTRACT

A memory that includes a memory device having a phase change layer that can be reset by using a reset gate is provided. A memory device includes memory elements arranged in two or more rows and two or more columns. Each memory element includes a pillar-shaped phase change layer, a reset gate insulating film surrounding the pillar-shaped phase change layer, and a reset gate surrounding the reset gate insulating film. The reset gates are connected in a row direction and in a column direction, and are heaters. The pillar-shaped phase change layers are electrically insulated from the reset gates.

22 Claims, 48 Drawing Sheets

(56) References Cited

FOREIGN PATENT DOCUMENTS

| JP | 2012-204404 A | 10/2012 |
| JP | 2004-356314 A | 12/2014 |
| WO | WO 2013/038553 A1 | 3/2013 |
| WO | WO 2013/093988 A1 | 6/2013 |

OTHER PUBLICATIONS

Search Report, and English language translation thereof, in corresponding International Application No. PCT/JP2014/054270, dated Apr. 15, 2014, 12 pages.

* cited by examiner

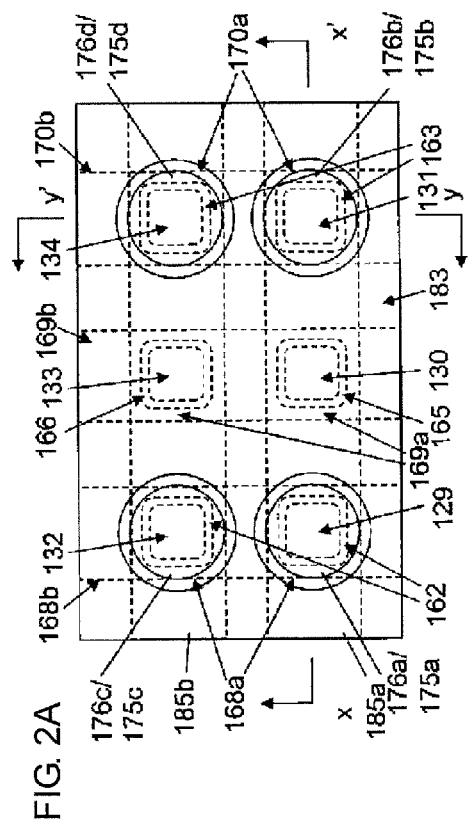
FIG. 2A
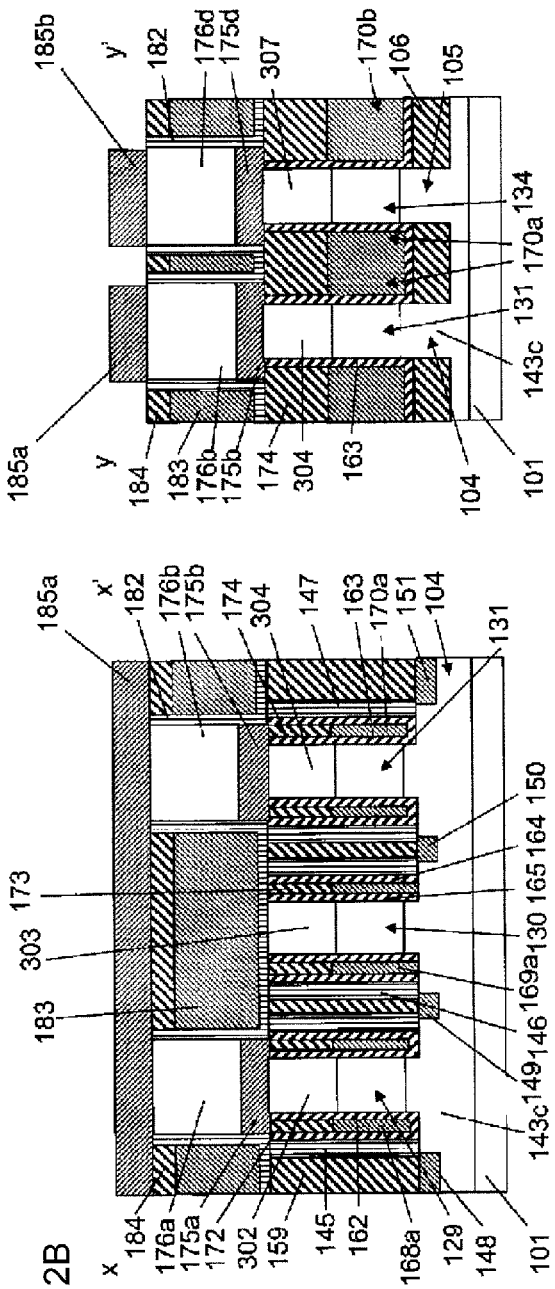
FIG. 2B
FIG. 2C

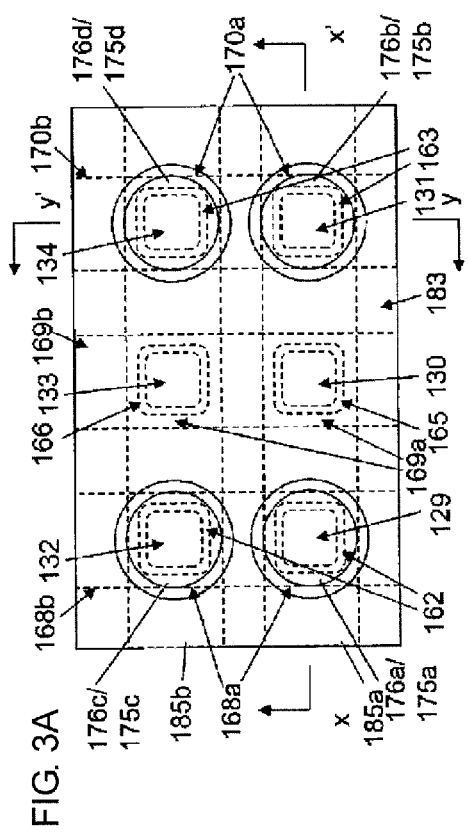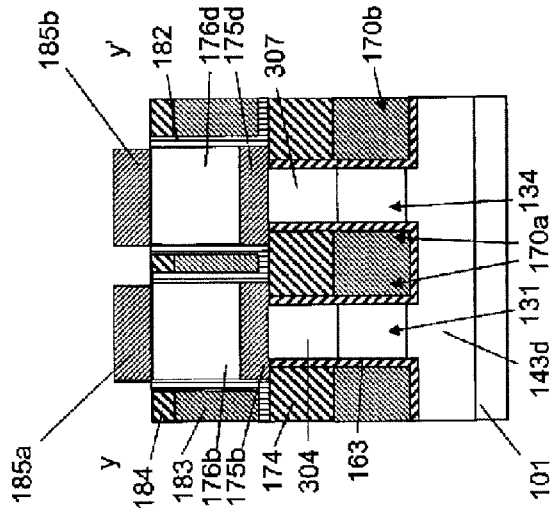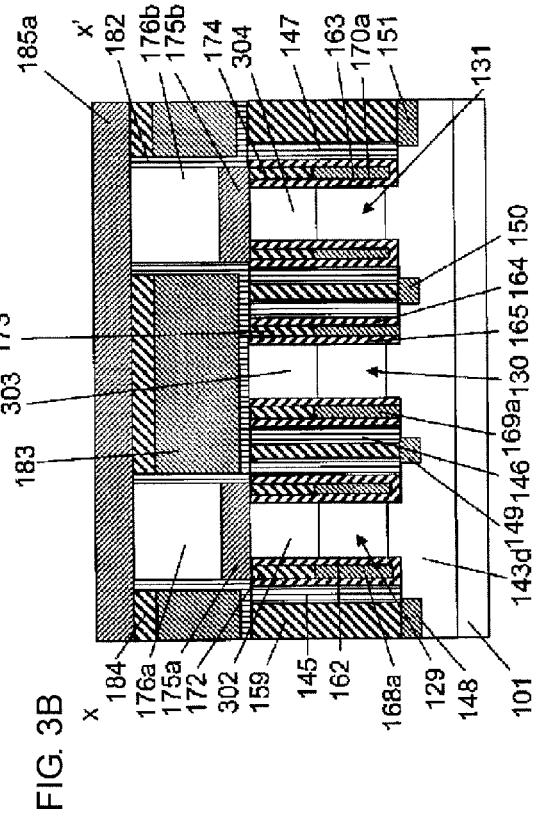

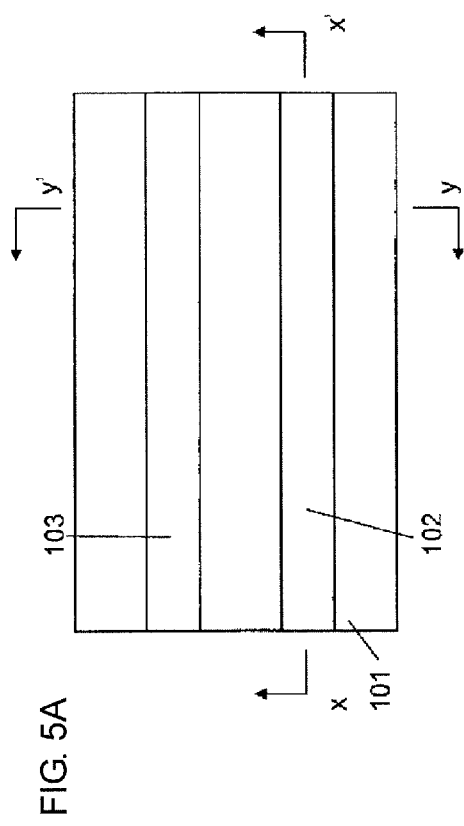
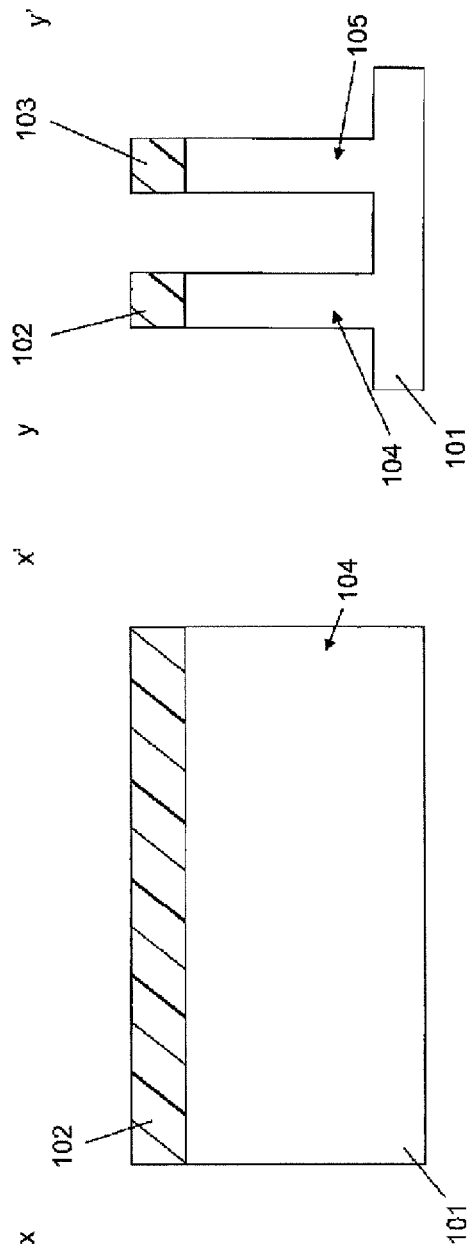
FIG. 5A
FIG. 5B
FIG. 5C

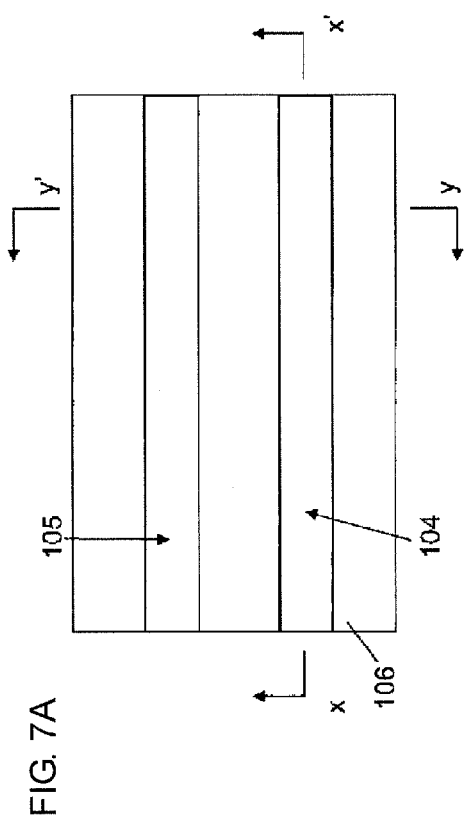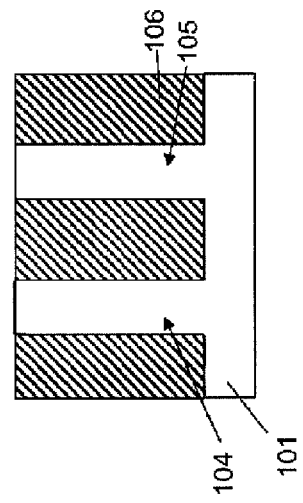
FIG. 7A
FIG. 7B
FIG. 7C

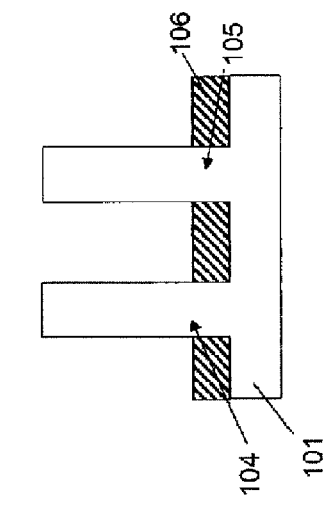
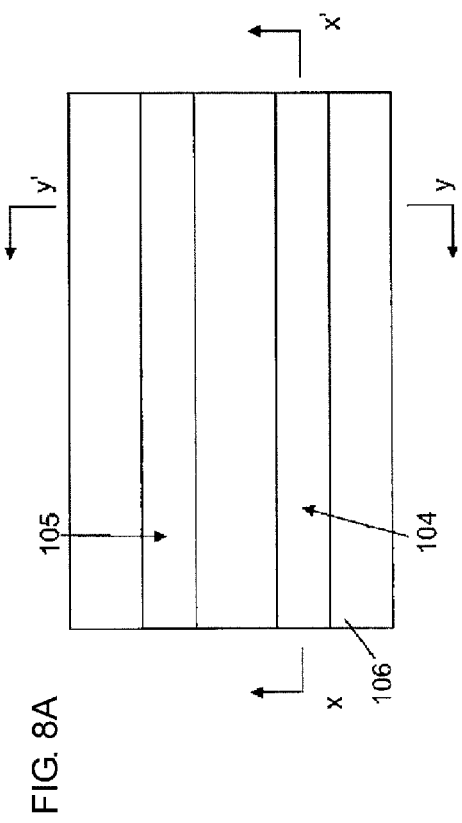
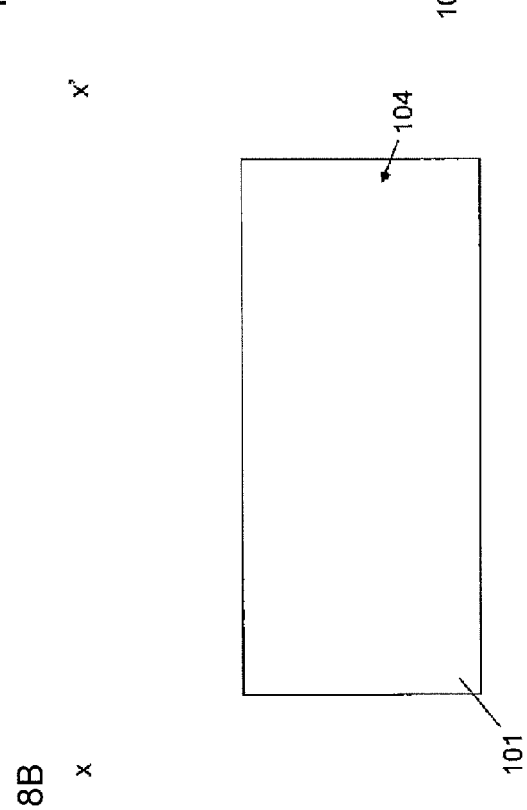
FIG. 8A
FIG. 8B
FIG. 8C

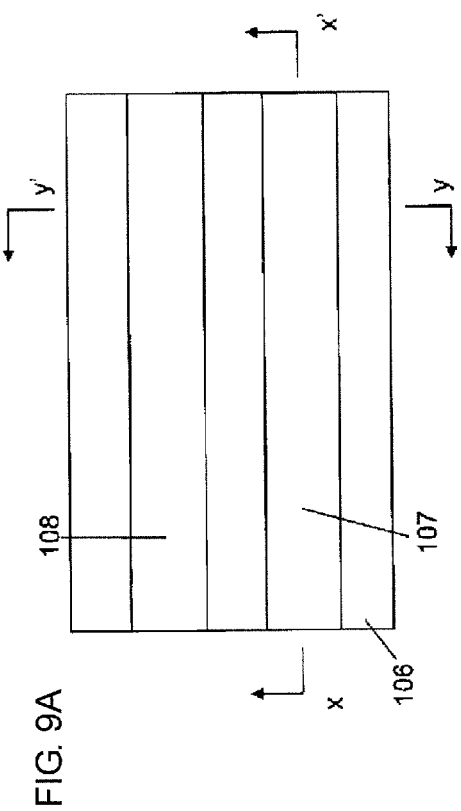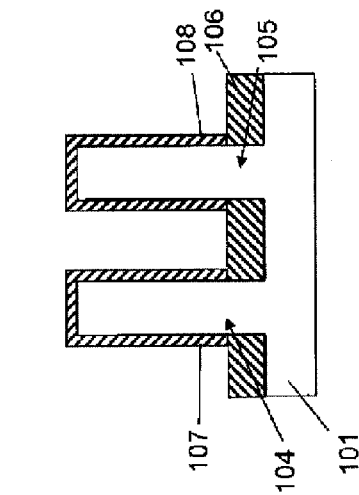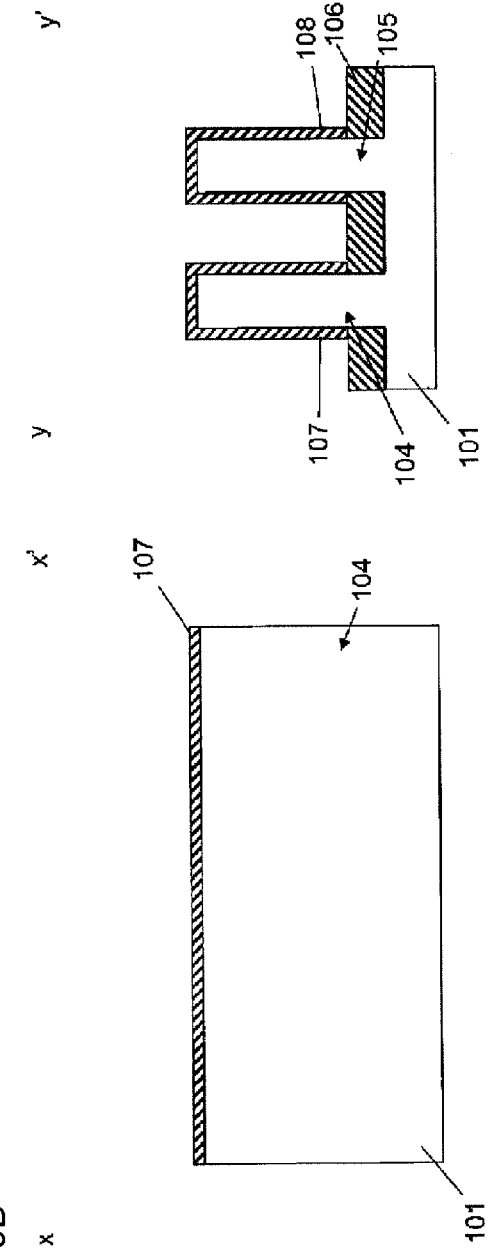
FIG. 9A
FIG. 9B
FIG. 9C

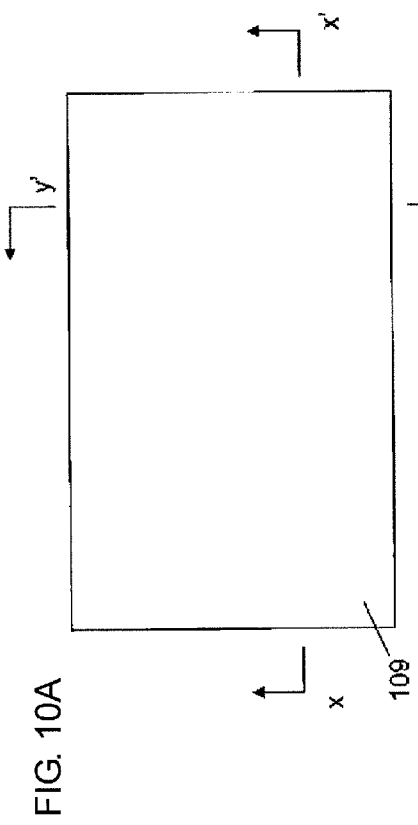
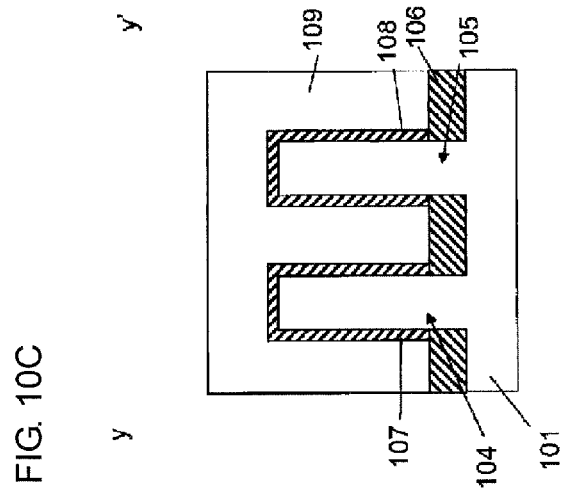
FIG. 10A
FIG. 10B
FIG. 10C

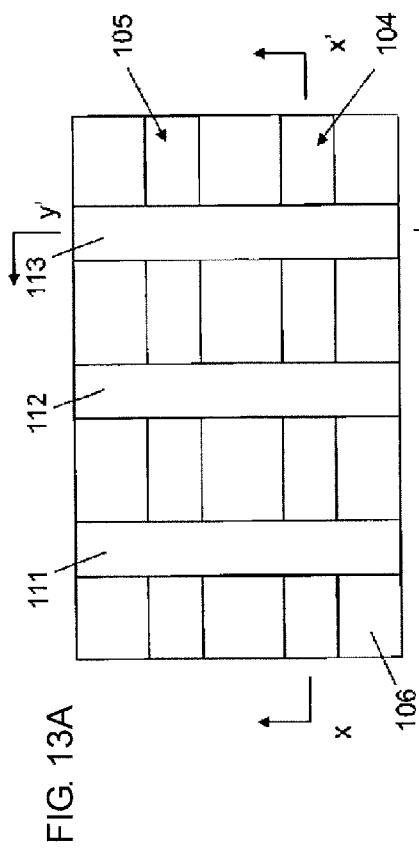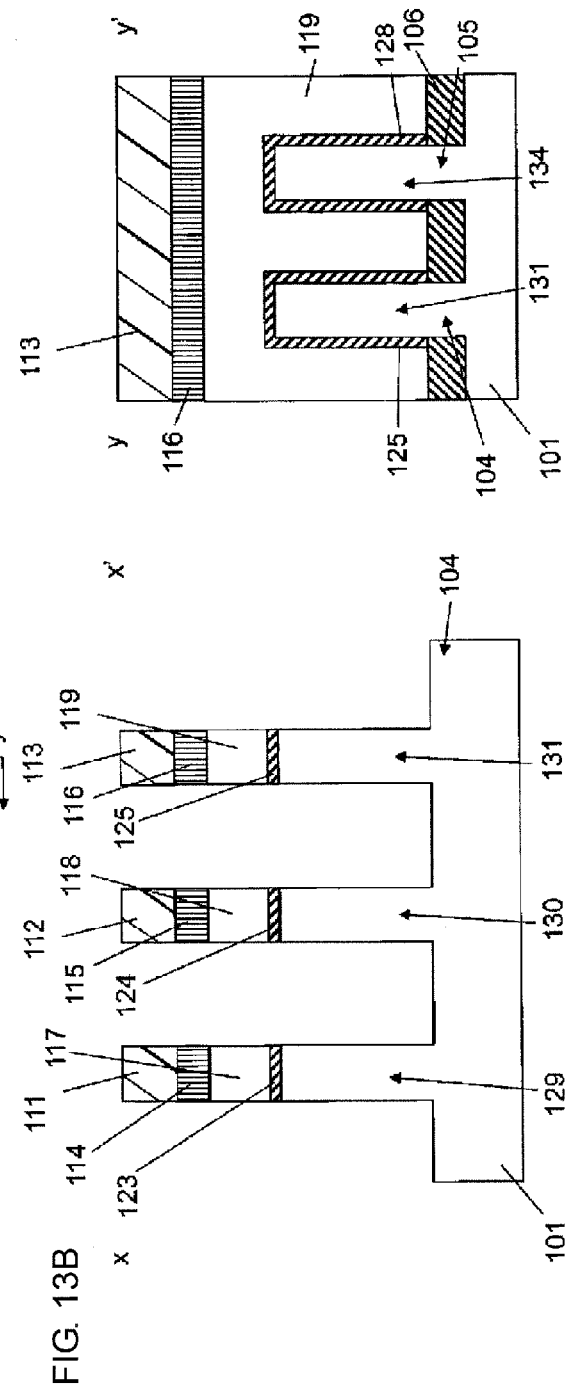
FIG. 13A
FIG. 13B
FIG. 13C

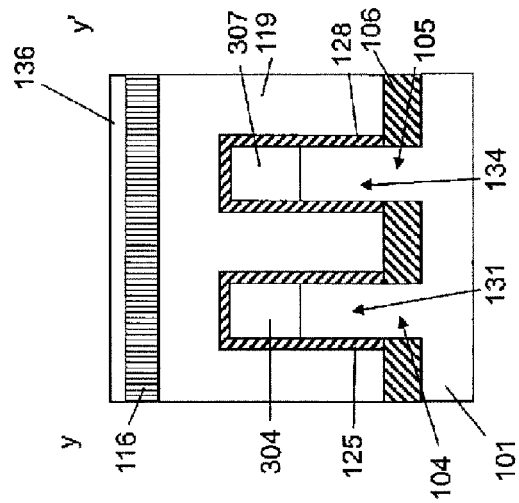
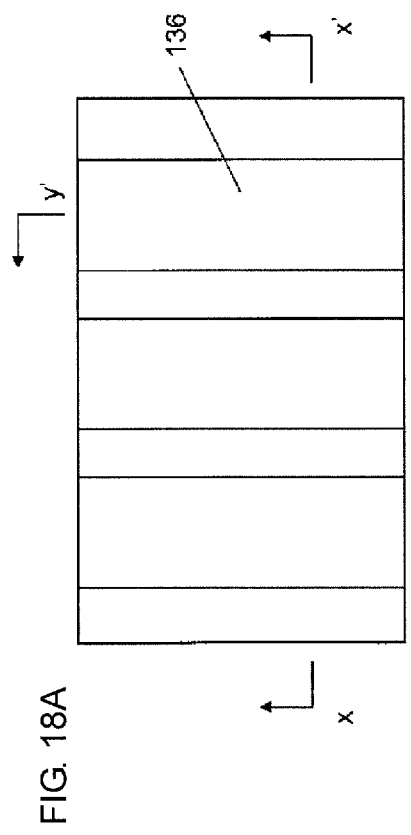
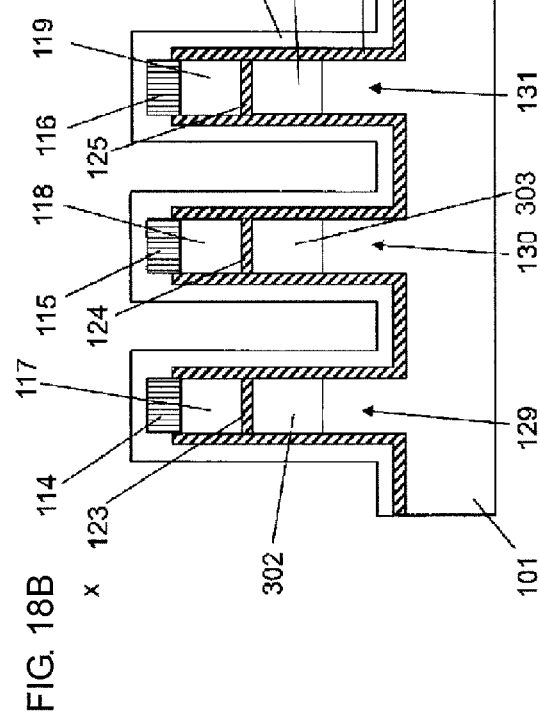
FIG. 18A
FIG. 18B
FIG. 18C

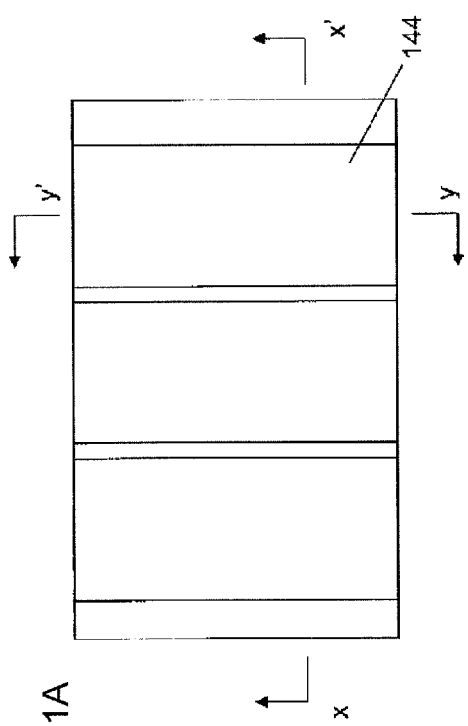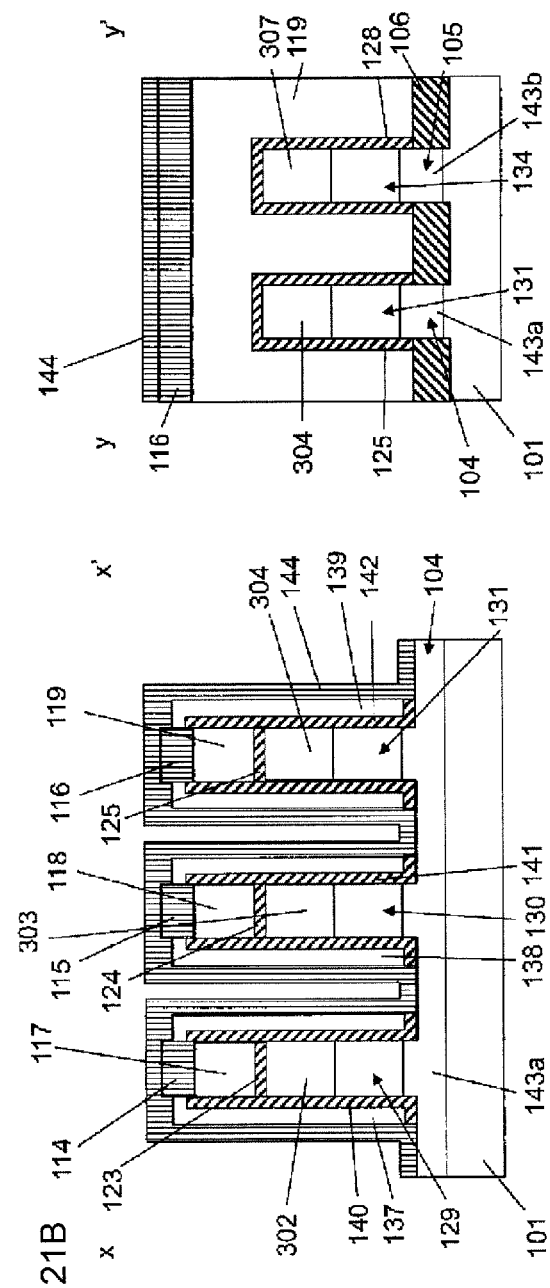
FIG. 21A
FIG. 21B
FIG. 21C

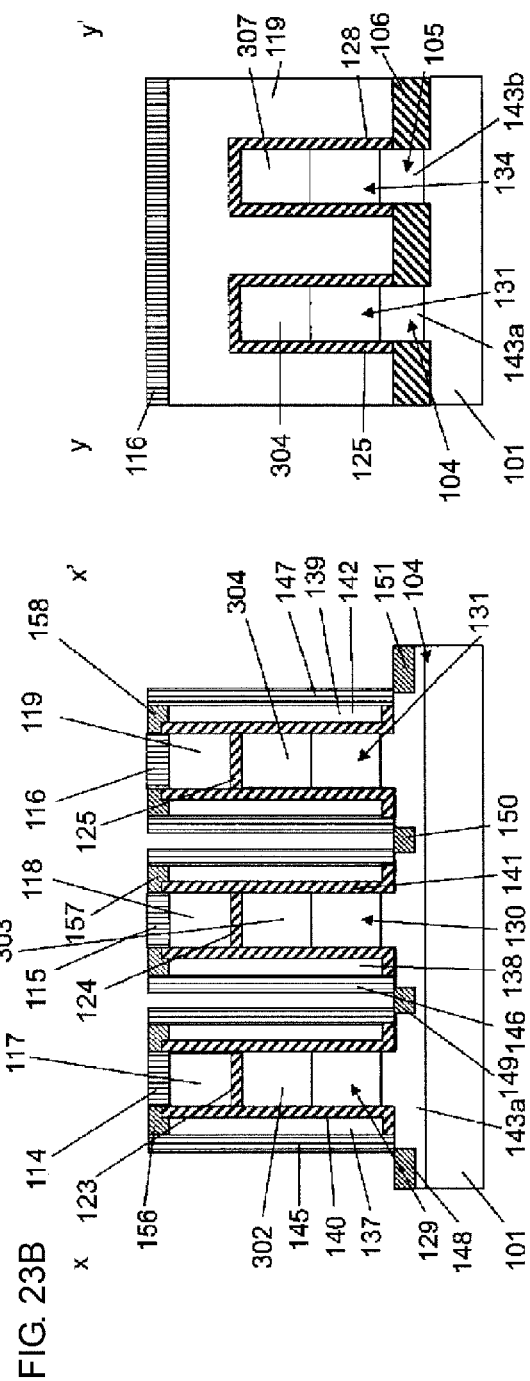

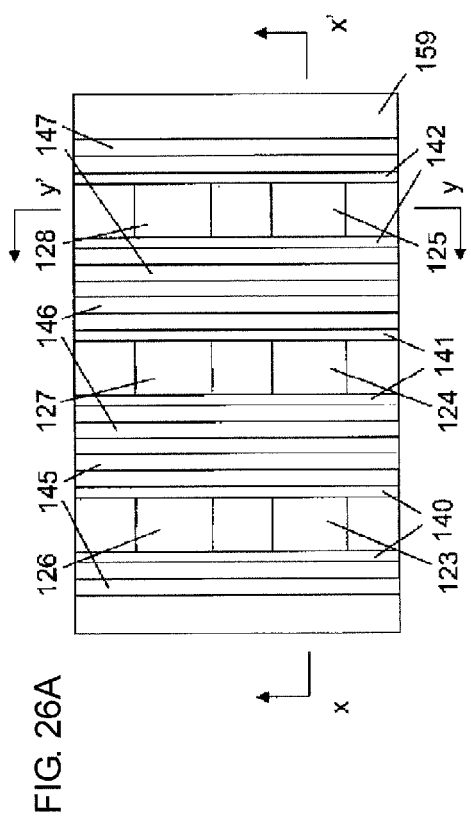
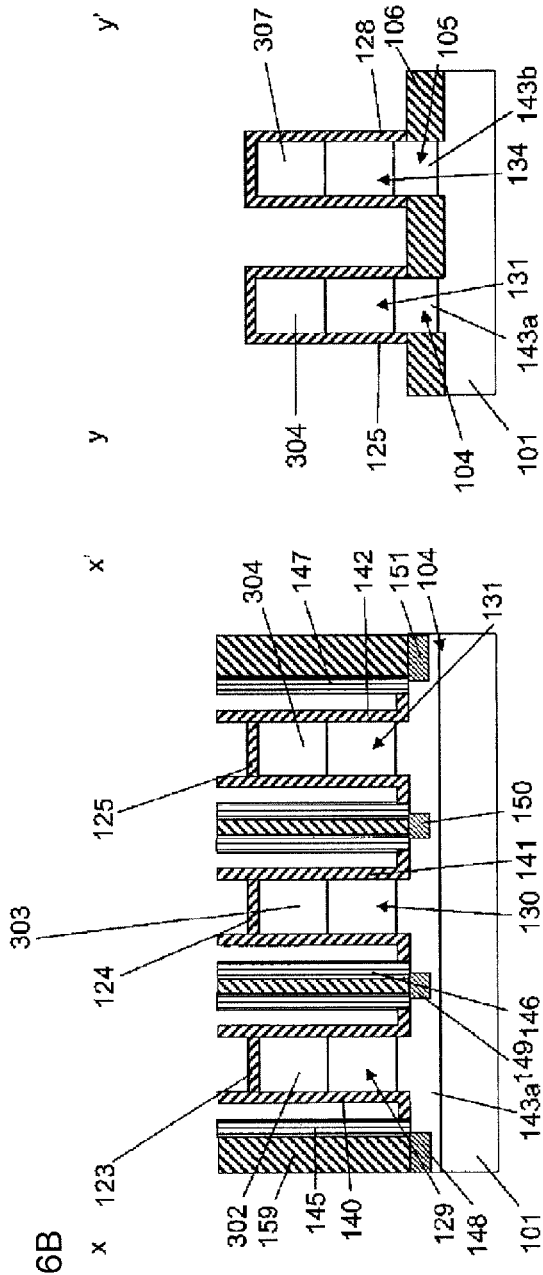
FIG. 26A
FIG. 26B
FIG. 26C

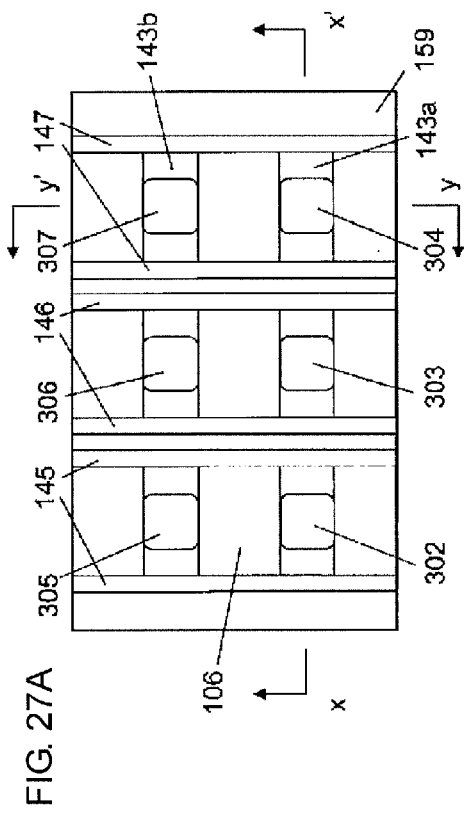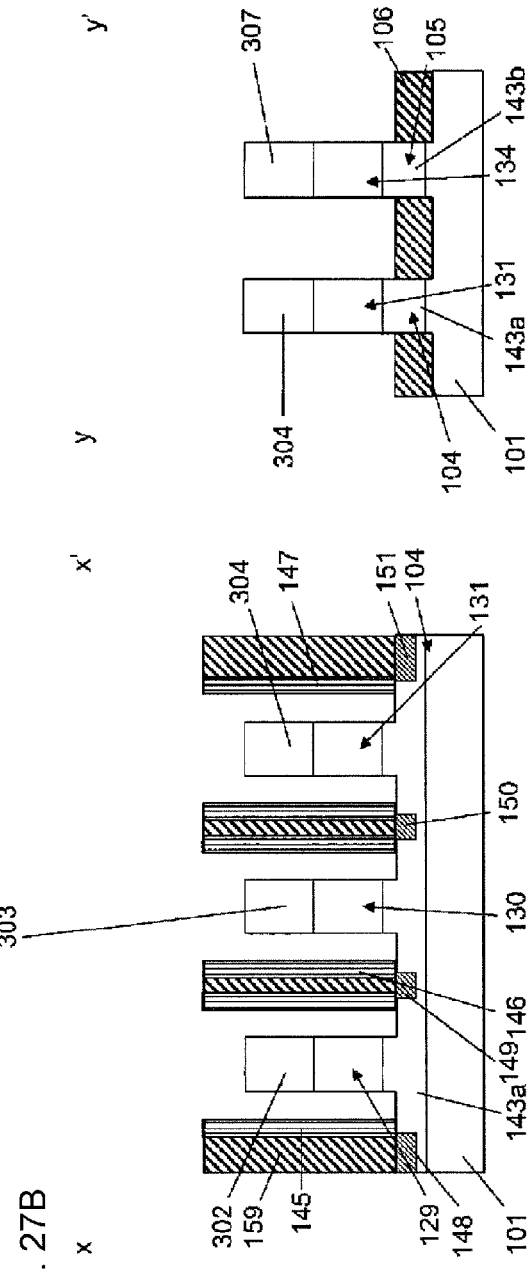
FIG. 27A
FIG. 27B
FIG. 27C

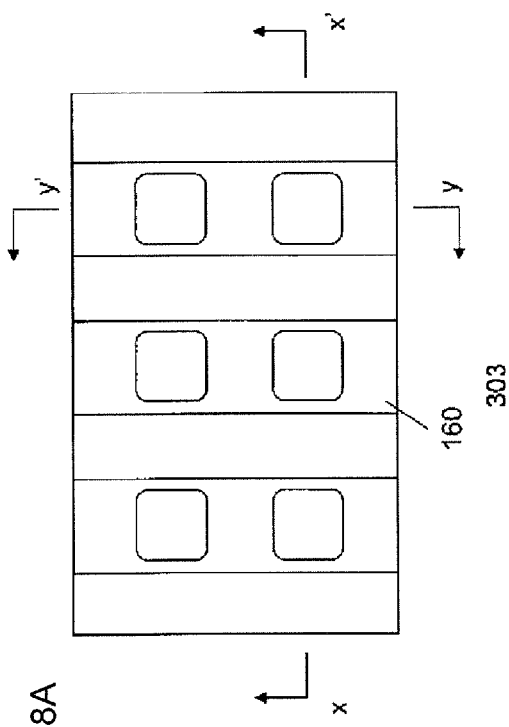
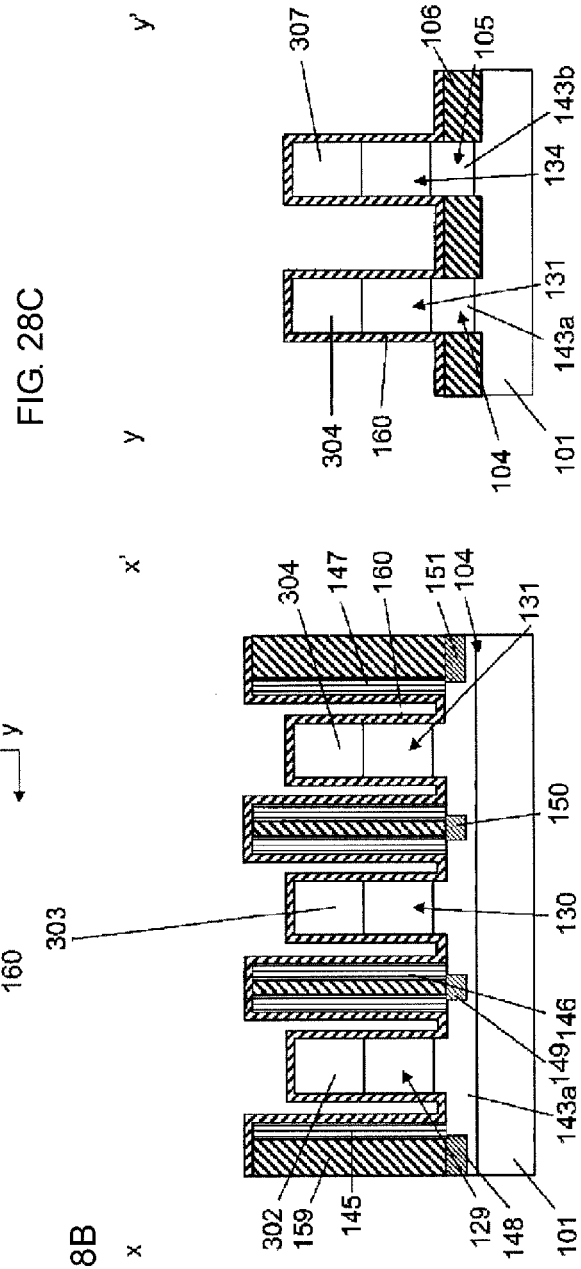
FIG. 28A
FIG. 28B
FIG. 28C

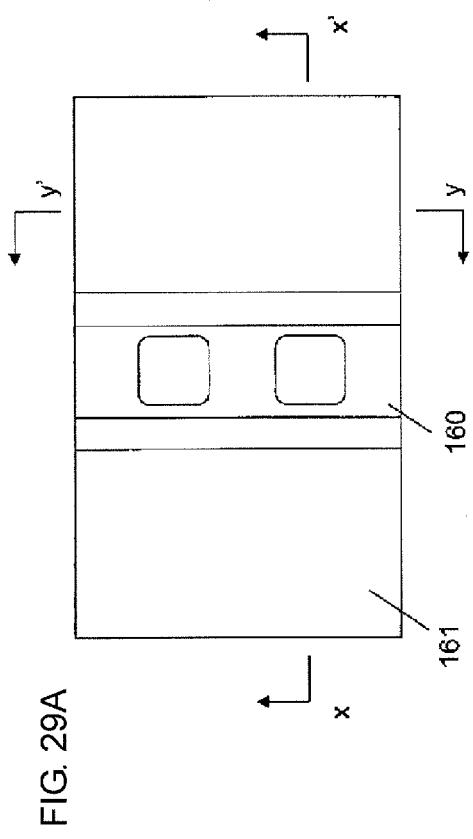
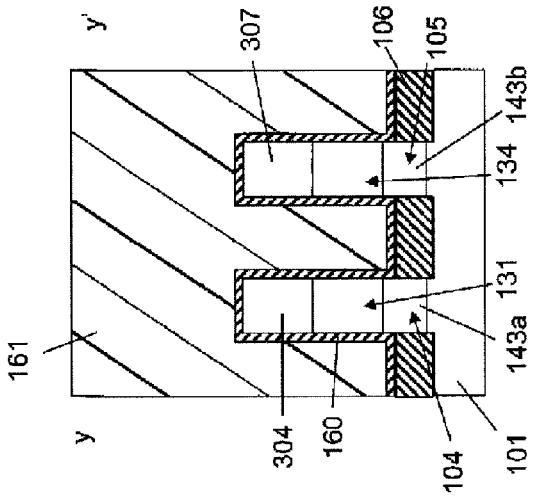
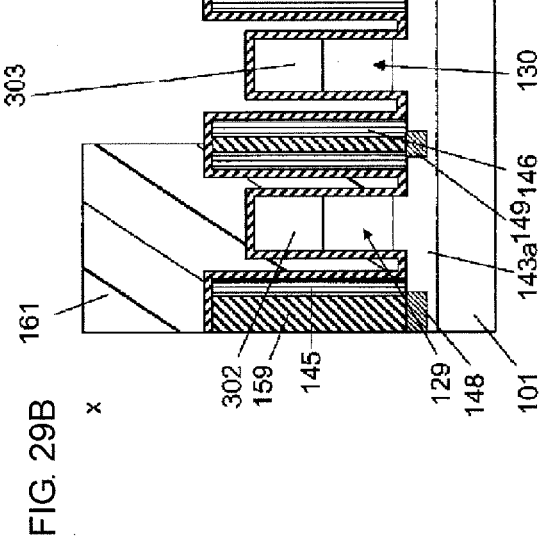
FIG. 29A
FIG. 29B
FIG. 29C

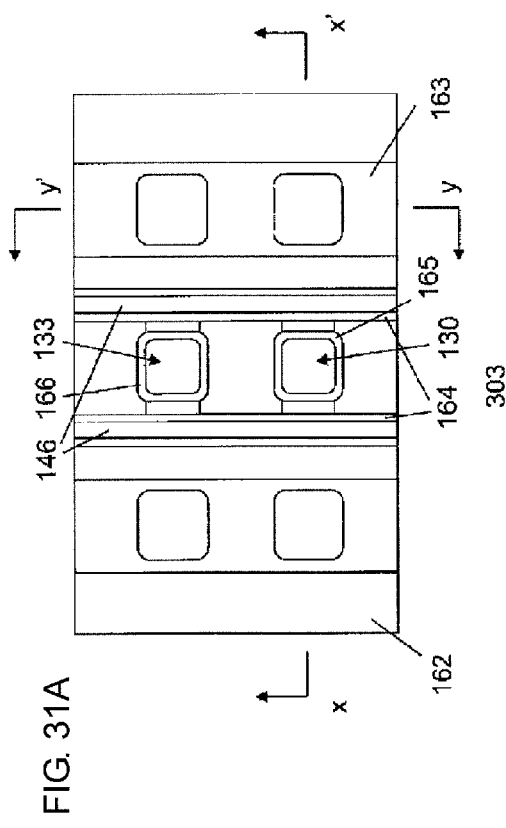
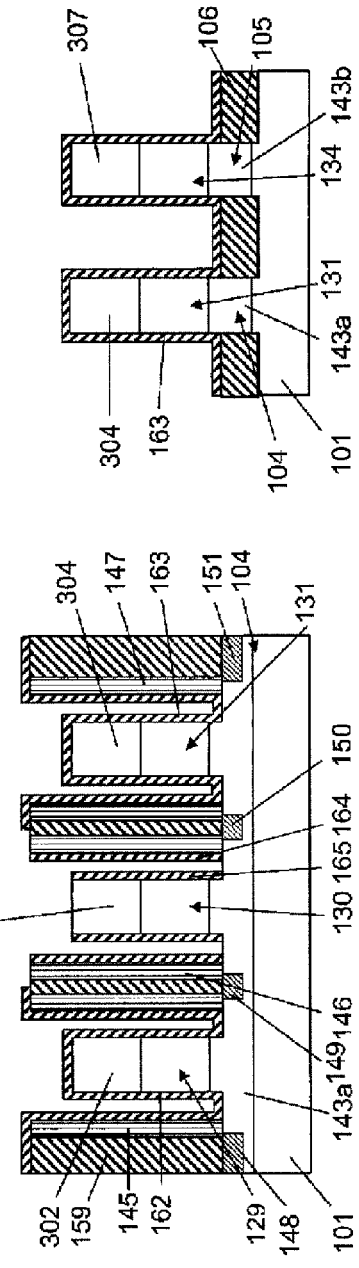
FIG. 31A
FIG. 31B
FIG. 31C

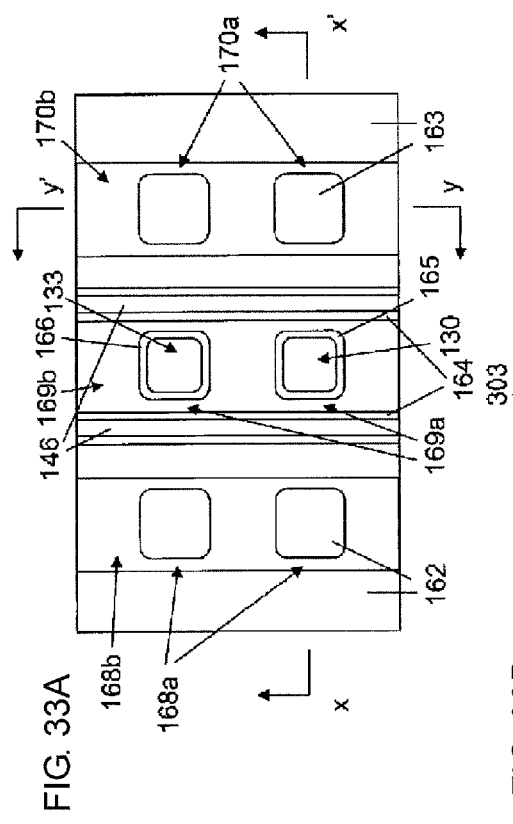
FIG. 33A
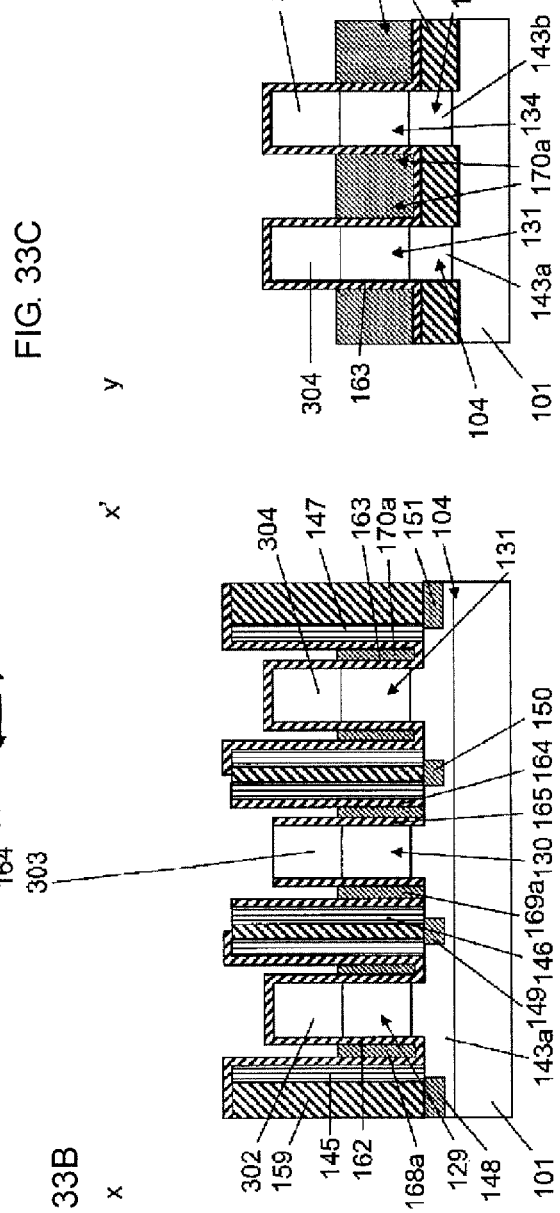
FIG. 33C
FIG. 33B

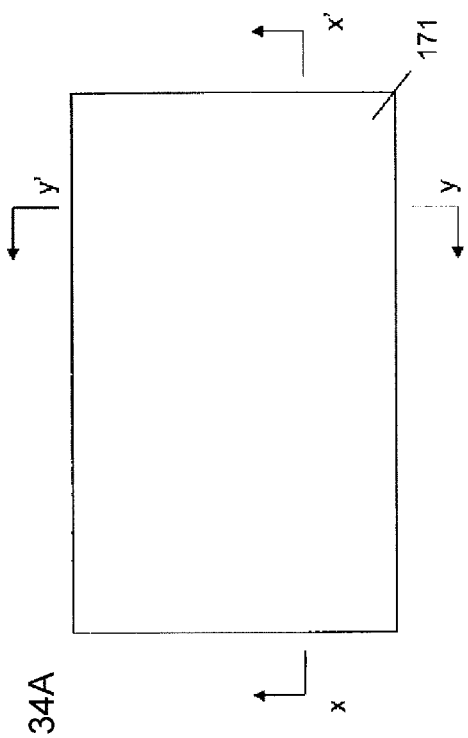
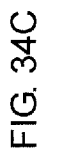
FIG. 34A
FIG. 34B
FIG. 34C

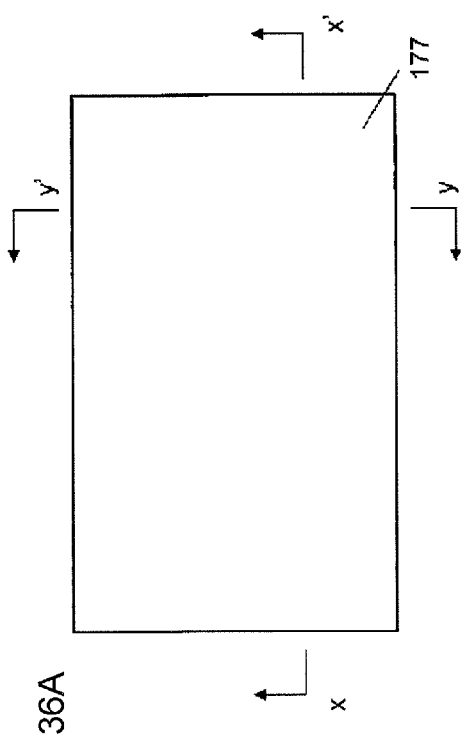
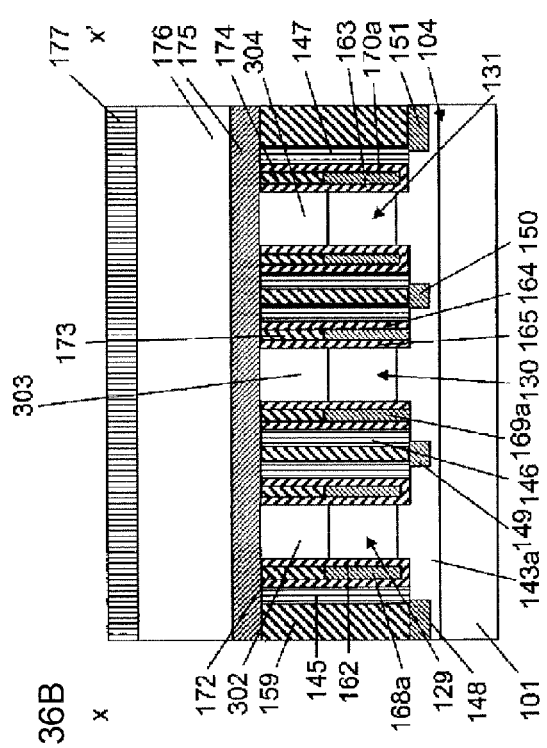
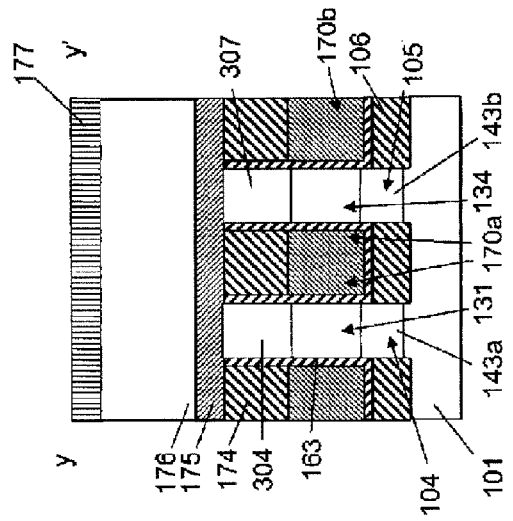
FIG. 36A
FIG. 36B
FIG. 36C

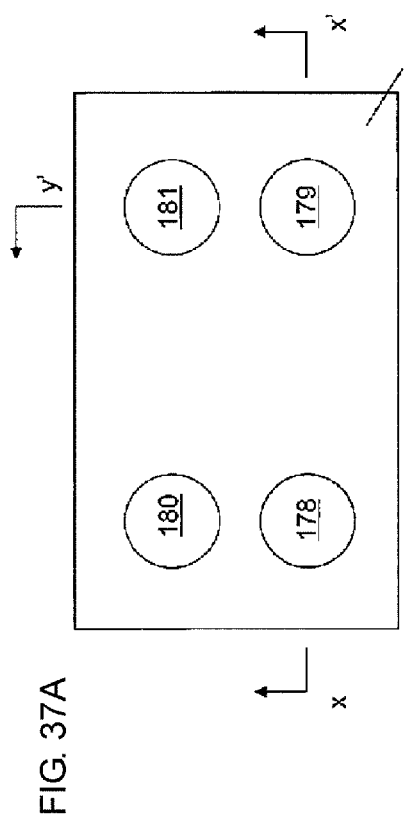
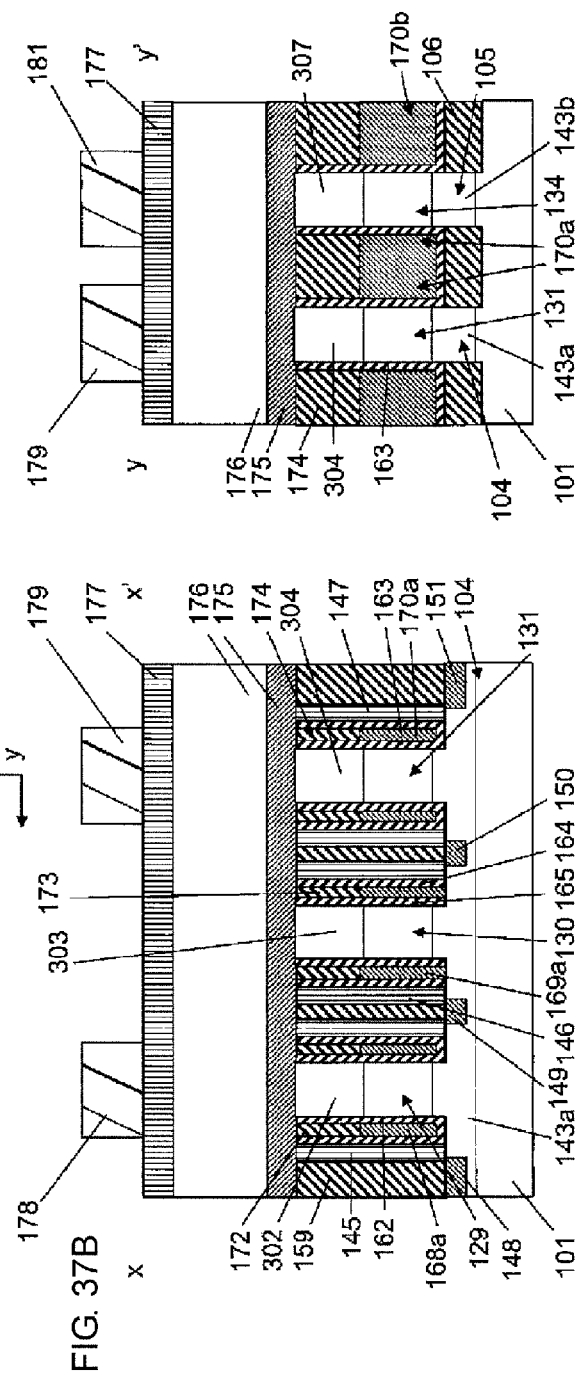
FIG. 37A
FIG. 37B
FIG. 37C

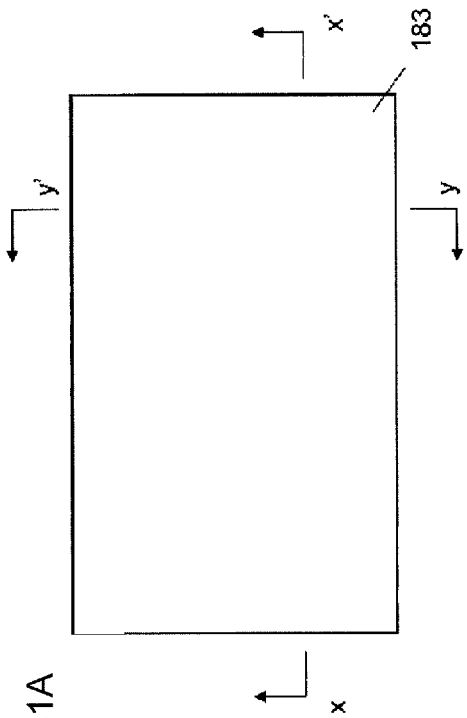
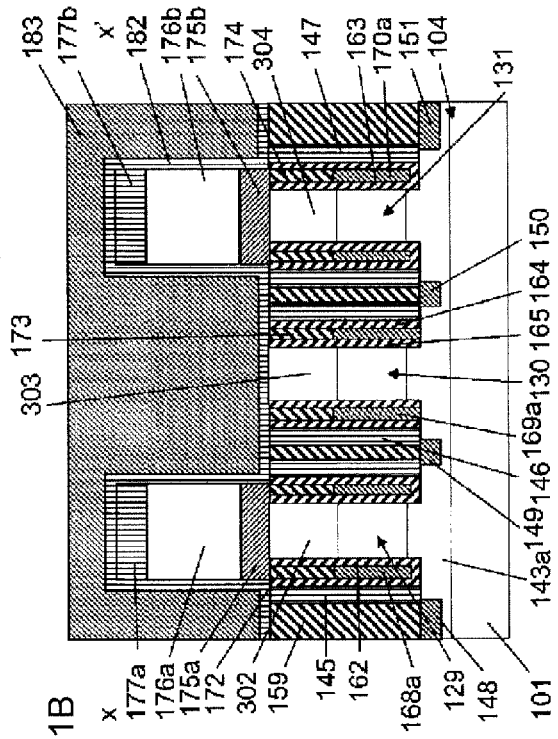
FIG. 41A
FIG. 41B
FIG. 41C

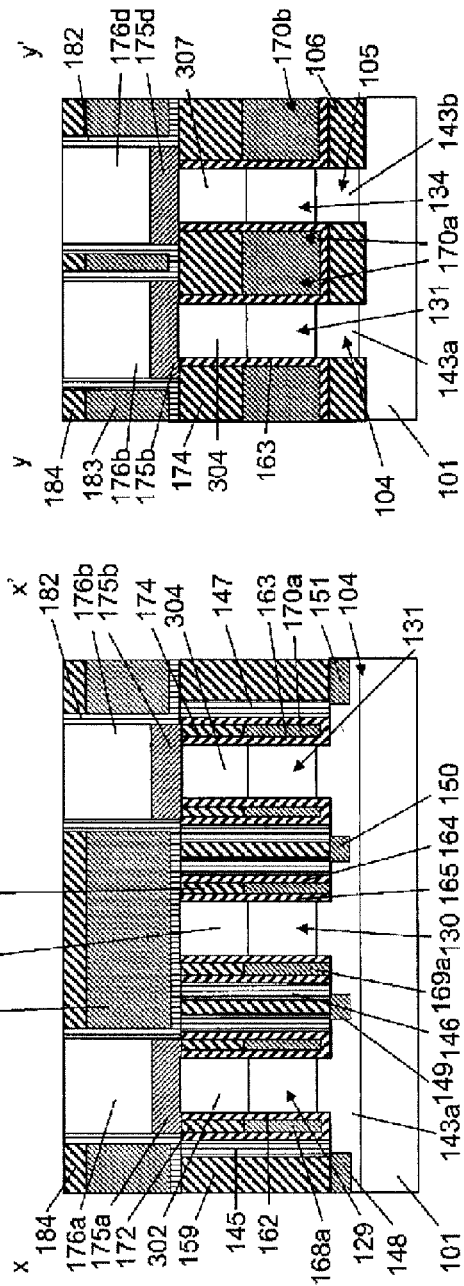

MEMORY DEVICE HAVING ELECTRICALLY INSULATED RESET GATE

CROSS REFERENCES TO RELATED APPLICATION

The present application is a continuation application of PCT/JP2014/054270, filed Feb. 24, 2014, the entire contents of which are incorporated herein by reference.

BACKGROUND OF THE INVENTION

1. Field of the Invention

The present invention relates to a memory device, a semiconductor device, and methods for producing a memory device and a semiconductor device.

2. Description of the Related Art

Phase change memories are an emerging memory technology (for example, refer to Japanese Unexamined Patent Application Publication No. 2012-204404) for storing data by recording changes in resistance of data memory elements in memory cells.

The mechanism thereof involves supplying an electric current between a bit line and a source line by turning a cell transistor ON so that heat generated from a heater of a high-resistance element melts chalcogenide glass (GST: $Ge_2Sb_2Te_5$) in contact with that heater and induces transition. Melting at high temperature (high current) and cooling at a high cooling rate (stopping the supply of current) generate an amorphous state (reset operation). Melting at a relatively low high temperature (low current) and cooling at a low cooling rate (gradually decreasing the current) result in crystallization (set operation). When data is being read, a high current flowing between the bit line and the source line (low resistance=crystalline state) indicates a binary 0, and a low current (high resistance=amorphous) indicates a binary 1 (for example, refer to Japanese Unexamined Patent Application Publication No. 2012-204404).

The reset current used in these memories is as high as 200 µA, for example. In order to cause such a high reset current to flow in a cell transistor, the size of the memory cell needs to be large. A selection element of a bipolar transistor or a diode can be used (for example, refer to Japanese Unexamined Patent Application Publication No. 2012-204404) in order to allow high current to flow.

Since a diode is a two-terminal element, in order to select a memory cell, selecting one source line causes electric current of all memory cells connected to that source line to flow in that one source line. Therefore, an IR drop attributable to the resistance of the source line is large.

In contrast, a bipolar transistor is a three-terminal element. However, since current flows in the base, it is difficult to connect a large number of transistors to a word line.

A surrounding gate transistor (hereinafter referred to as an SGT) that includes a source, a gate, and a drain arranged in a direction perpendicular to a substrate, and a gate electrode surrounding a pillar-shaped semiconductor layer has been proposed (for example, refer to Japanese Unexamined Patent Application Publication No. 2004-356314). Since the source, gate, and drain are arranged in a direction perpendicular to the substrate, a small cell area can be achieved.

SUMMARY OF THE INVENTION

It is desirable to provide a memory that includes a memory element having a phase change layer which can be reset by using a reset gate.

A first aspect of the present invention provides a memory device comprising a plurality of memory elements arranged in two or more rows and two or more columns. Each of the memory elements comprises a pillar-shaped phase change layer, a reset gate insulating film surrounding the pillar-shaped phase change layer, and a reset gate surrounding the reset gate insulating film. The reset gates are connected in a row direction and in a column direction, and are heaters, and the pillar-shaped phase change layers are electrically insulated from the reset gates.

A lower electrode can be provided under the pillar-shaped phase change layer.

The reset gate can be formed of titanium nitride.

The reset gate insulating film can be formed of a nitride film.

The lower electrode can be formed of titanium nitride.

The phase change layer can be reset by supplying an electric current to the reset gate.

A second aspect of the present invention provides a memory device comprising first pillar-shaped semiconductor layers, gate insulating films formed around the first pillar-shaped semiconductor layers, gate electrodes formed around the gate insulating films, gate lines connected to the gate electrodes, first diffusion layers formed in upper portions of the first pillar-shaped semiconductor layers, second diffusion layers formed in lower portions of the first pillar-shaped semiconductor layers, and a plurality of memory elements arranged in two or more rows and two or more columns and formed on the first diffusion layers, each memory element comprising a pillar-shaped phase change layer, a reset gate insulating film surrounding the pillar-shaped phase change layer, and a reset gate surrounding the reset gate insulating film. The reset gates are connected in a row direction and in a column direction, and are heaters. The pillar-shaped phase change layers are electrically insulated from the reset gates.

A lower electrode can be provided under the pillar-shaped phase change layer.

The reset gate can be formed of titanium nitride.

The reset gate insulating film can be formed of a nitride film.

The lower electrode can be formed of titanium nitride.

The phase change layer can be reset by supplying an electric current to the reset gate.

The first pillar-shaped semiconductor layers may be formed on fin-shaped semiconductor layers formed on a semiconductor substrate and surrounded by a first insulating film. The gate insulating films may also be formed around and at bottoms of the gate electrodes and the gate lines. The gate electrodes may be formed of a metal, the gate lines may be formed of a metal, the gate lines may extend in a direction perpendicular to a direction in which the fin-shaped semiconductor layers extend, and the second diffusion layers may also be formed in the fin-shaped semiconductor layers.

The second diffusion layers may also be formed in the semiconductor substrate.

A contact line parallel to the gate lines and connected to the second diffusion layers can be provided.

The memory device may further comprise second pillar-shaped semiconductor layers formed on the fin-shaped semiconductor layers; and contact electrodes formed of a metal formed around the second pillar-shaped semiconductor layers. The contact line may be formed of a metal extending in the direction perpendicular to the direction in which the fin-shaped semiconductor layers extend, and may be connected to the contact electrodes. The second diffusion layers may be formed in the fin-shaped semiconductor layers and lower portions of the second pillar-shaped semiconductor layers. The contact electrodes may be connected to the second diffusion layers.

An outer width of the gate electrodes is equal to a width of the gate lines. A width of the first pillar-shaped semiconductor layers in the direction perpendicular to the direction in which the fin-shaped semiconductor layers extend is equal to a width of the fin-shaped semiconductor layers in the direction perpendicular to the direction in which the fin-shaped semiconductor layers extend.

The gate insulating films can be formed between the second pillar-shaped semiconductor layers and the contact electrodes.

A width of the second pillar-shaped semiconductor layers in the direction perpendicular to the direction in which the fin-shaped semiconductor layers extend may be equal to a width of the fin-shaped semiconductor layers in the direction perpendicular to the direction in which the fin-shaped semiconductor layers extend.

The gate insulating films may be formed around the contact electrodes and the contact line.

An outer width of the contact electrodes may be equal to a width of the contact line.

The first pillar-shaped semiconductor layers may be formed on a semiconductor substrate. The gate insulating films may be formed around and at bottoms of the gate electrodes and the gate lines. The gate electrodes may be formed of a metal. The gate lines may be formed of a metal. The second diffusion layers may also be formed in the semiconductor substrate.

A third aspect of the present invention provides a method for producing a memory device, the method comprising a sixth step of forming pillar-shaped phase change layers and lower electrodes arranged in two or more rows and two or more columns on a semiconductor substrate, forming a reset gate insulating film that surrounds the pillar-shaped phase change layers and the lower electrodes, and forming a reset gate that surrounds the pillar-shaped phase change layers that function as memory devices arranged in two or more rows and two or more columns.

A fourth aspect of the present invention provides a method for producing a semiconductor device. The method comprises a first step of forming fin-shaped semiconductor layers on a semiconductor substrate and forming a first insulating film around the fin-shaped semiconductor layers; a second step following the first step, the second step including forming a second insulating film around the fin-shaped semiconductor layers, depositing and planarizing a first polysilicon on the second insulating film, forming a second resist for forming gate lines, first pillar-shaped semiconductor layers, second pillar-shaped semiconductor layers, and a contact line so that the second resist extends in a direction perpendicular to a direction in which the fin-shaped semiconductor layers extend, and etching the first polysilicon, the second insulating film, and the fin-shaped semiconductor layers so as to form first pillar-shaped semiconductor layers, first dummy gates formed of the first polysilicon, second pillar-shaped semiconductor layers, and second dummy gates formed of the first polysilicon; a third step following the second step, the third step including forming a fourth insulating film around the first pillar-shaped semiconductor layers, the second pillar-shaped semiconductor layers, the first dummy gates, and the second dummy gates, depositing a second polysilicon around the fourth insulating film, and etching the second polysilicon so as to allow the second polysilicon to remain on side walls of the first dummy gates, the first pillar-shaped semiconductor layers, the second dummy gates, and the second pillar-shaped semiconductor layers so as to form third dummy gates and fourth dummy gates; a fourth step of forming second diffusion layers in upper portions of the fin-shaped semiconductor layers, lower portions of the first pillar-shaped semiconductor layers, and lower portions of the second pillar-shaped semiconductor layers, forming a fifth insulating film around the third dummy gates and the fourth dummy gates, etching the fifth insulating film into a side wall shape so as to form side walls formed of the fifth insulating film, and forming a metal-semiconductor compound on the second diffusion layers; a fifth step following the fourth step, the fifth step including depositing and planarizing an interlayer insulating film, exposing upper portions of the first dummy gates, the second dummy gates, the third dummy gates, and the fourth dummy gates, removing the first dummy gates, the second dummy gates, the third dummy gates, and the fourth dummy gates, removing the second insulating film and the fourth insulating film, forming a gate insulating film around the first pillar-shaped semiconductor layers, around the second pillar-shaped semiconductor layers, and on an inner side of the fifth insulating film, forming a fourth resist for removing the gate insulating film around bottom portions of the second pillar-shaped semiconductor layers, removing the gate insulating film around the bottom portions of the second pillar-shaped semiconductor layers, depositing a metal, and etching back the metal so as to form gate electrodes and gate lines around the first pillar-shaped semiconductor layers and form contact electrodes and a contact line around the second pillar-shaped semiconductor layers; and a sixth step following the fifth step, the sixth step including depositing and planarizing a second interlayer insulating film to expose upper portions of the first pillar-shaped semiconductor layers, forming pillar-shaped phase change layers and lower electrodes on the exposed first pillar-shaped semiconductor layers, forming a reset gate insulating film that surrounds the pillar-shaped phase change layers and the lower electrodes, and forming a reset gate that surrounds the pillar-shaped phase change layers that function as memory devices.

The method may further comprise forming a third insulating film on the first polysilicon after the first polysilicon is deposited and planarized on the second insulating film.

After the fourth insulating film is formed around the first pillar-shaped semiconductor layers, the first dummy gates, the second pillar-shaped semiconductor layers, and the second dummy gates, a third resist may be formed and etched back to expose upper portions of the first pillar-shaped semiconductor layers, and first diffusion layers may be formed in the upper portions of the first pillar-shaped semiconductor layers.

According to the present invention, a memory that includes a memory device having a phase change layer that can be reset by using a reset gate can be provided.

Memory elements each including a pillar-shaped phase change layer, a reset gate insulating film surrounding the pillar-shaped phase change layer, and a reset gate surrounding the reset gate insulating film are arranged in two or more rows and two or more columns, and the reset gates are connected in a row direction and a column direction. Moreover, the reset gates are heaters, and the pillar-shaped phase change layers are electrically insulated from the reset gates. According to this structure, the reset gates which are heaters generate heat when an electric current is supplied, and the heat melts chalcogenide glass (GST: $Ge_2Sb_2Te_5$) in contact with the heaters to cause phase transition. Moreover, since the reset gates are shared in the row direction and the column direction, the memory elements in two or more rows and two or more columns can be reset at once.

Since the reset gate surrounds the pillar-shaped phase change layer, the pillar-shaped phase change layer is easily heated.

Since reset operation is conducted by supplying an electric current to the reset gate, there is no need to supply high current to selection elements. Thus, the selection elements are to be configured so that low current for set operation can flow therein.

BRIEF DESCRIPTION OF THE DRAWINGS

FIG. 2A is a plan view of another memory device according to the present invention, FIG. 2B is a cross-sectional view taken along line x-x' in FIG. 2A, and FIG. 2C is a cross-sectional view taken along line y-y' in FIG. 2A.

FIG. 3A is a plan view of yet another memory device according to the present invention, FIG. 3B is a cross-sectional view taken along line x-x' in FIG. 3A, and FIG. 3C is a cross-sectional view taken along line y-y' in FIG. 3A.

FIG. 5A is a plan view related to the method for producing a memory device according to the present invention, FIG. 5B is a cross-sectional view taken along line x-x' in FIG. 5A, and FIG. 5C is a cross-sectional view taken along line y-y' in FIG. 5A.

FIG. 7A is a plan view related to the method for producing a memory device according to the present invention, FIG. 7B is a cross-sectional view taken along line x-x' in FIG. 7A, and FIG. 7C is a cross-sectional view taken along line y-y' in FIG. 7A.

FIG. 8A is a plan view related to the method for producing a memory device according to the present invention, FIG. 8B is a cross-sectional view taken along line x-x' in FIG. 8A, and FIG. 8C is a cross-sectional view taken along line y-y' in FIG. 8A.

FIG. 9A is a plan view related to the method for producing a memory device according to the present invention, FIG. 9B is a cross-sectional view taken along line x-x' in FIG. 9A, and FIG. 9C is a cross-sectional view taken along line y-y' in FIG. 9A.

FIG. 10A is a plan view related to the method for producing a memory device according to the present invention, FIG. 10B is a cross-sectional view taken along line x-x' in FIG. 10A, and FIG. 10C is a cross-sectional view taken along line y-y' in FIG. 10A.

FIG. 13A is a plan view related to the method for producing a memory device according to the present invention, FIG. 13B is a cross-sectional view taken along line x-x' in FIG. 13A, and FIG. 13C is a cross-sectional view taken along line y-y' in FIG. 13A.

FIG. 18A is a plan view related to the method for producing a memory device according to the present invention, FIG. 18B is a cross-sectional view taken along line x-x' in FIG. 18A, and FIG. 18C is a cross-sectional view taken along line y-y' in FIG. 18A.

FIG. 21A is a plan view related to the method for producing a memory device according to the present invention, FIG. 21B is a cross-sectional view taken along line x-x' in FIG. 21A, and FIG. 21C is a cross-sectional view taken along line y-y' in FIG. 21A.

FIG. 23A is a plan view related to the method for producing a memory device according to the present invention, FIG. 23B is a cross-sectional view taken along line x-x' in FIG. 23A, and FIG. 23C is a cross-sectional view taken along line y-y' in FIG. 23A.

FIG. 26A is a plan view related to the method for producing a memory device according to the present invention, FIG. 26B is a cross-sectional view taken along line x-x' in FIG. 26A, and FIG. 26C is a cross-sectional view taken along line y-y' in FIG. 26A.

FIG. 27A is a plan view related to the method for producing a memory device according to the present invention, FIG. 27B is a cross-sectional view taken along line x-x' in FIG. 27A, and FIG. 27C is a cross-sectional view taken along line y-y' in FIG. 27A.

FIG. 28A is a plan view related to the method for producing a memory device according to the present invention, FIG. 28B is a cross-sectional view taken along line x-x' in FIG. 28A, and FIG. 28C is a cross-sectional view taken along line y-y' in FIG. 28A.

FIG. 29A is a plan view related to the method for producing a memory device according to the present invention, FIG. 29B is a cross-sectional view taken along line x-x' in FIG. 29A, and FIG. 29C is a cross-sectional view taken along line y-y' in FIG. 29A.

FIG. 31A is a plan view related to the method for producing a memory device according to the present invention, FIG. 31B is a cross-sectional view taken along line x-x' in FIG. 31A, and FIG. 31C is a cross-sectional view taken along line y-y' in FIG. 31A.

FIG. 33A is a plan view related to the method for producing a memory device according to the present invention, FIG. 33B is a cross-sectional view taken along line x-x' in FIG. 33A, and FIG. 33C is a cross-sectional view taken along line y-y' in FIG. 33A.

FIG. 34A is a plan view related to the method for producing a memory device according to the present invention, FIG. 34B is a cross-sectional view taken along line x-x' in FIG. 34A, and FIG. 34C is a cross-sectional view taken along line y-y' in FIG. 34A.

FIG. 36A is a plan view related to the method for producing a memory device according to the present invention, FIG. 36B is a cross-sectional view taken along line x-x' in FIG. 36A, and FIG. 36C is a cross-sectional view taken along line y-y' in FIG. 36A.

FIG. 37A is a plan view related to the method for producing a memory device according to the present invention, FIG. 37B is a cross-sectional view taken along line x-x' in FIG. 37A, and FIG. 37C is a cross-sectional view taken along line y-y' in FIG. 37A.

FIG. 41A is a plan view related to the method for producing a memory device according to the present invention, FIG. 41B is a cross-sectional view taken along line x-x' in FIG. 41A, and FIG. 41C is a cross-sectional view taken along line y-y' in FIG. 41A.

FIG. 44A is a plan view related to the method for producing a memory device according to the present invention, FIG. 44B is a cross-sectional view taken along line x-x' in FIG. 44A, and FIG. 44C is a cross-sectional view taken along line y-y' in FIG. 44A.

DETAILED DESCRIPTION OF THE PREFERRED EMBODIMENTS

Figure 1A:
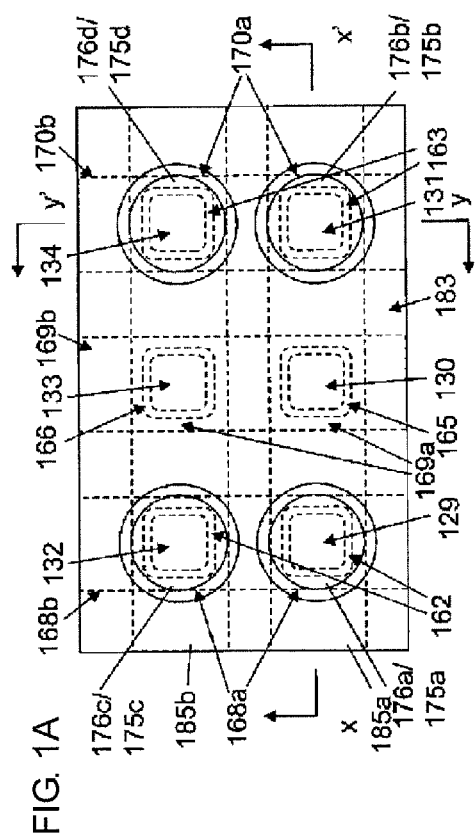
FIG. 1A is a plan view of a memory device according to the present invention.
Figure 1C:
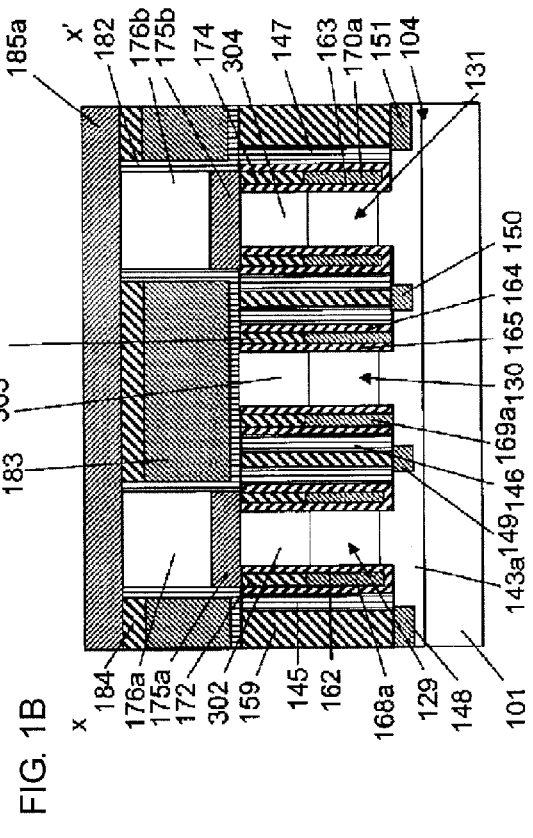
FIG. 1C is a cross-sectional view taken along line y-y' in FIG. 1A.
Figure 1B:
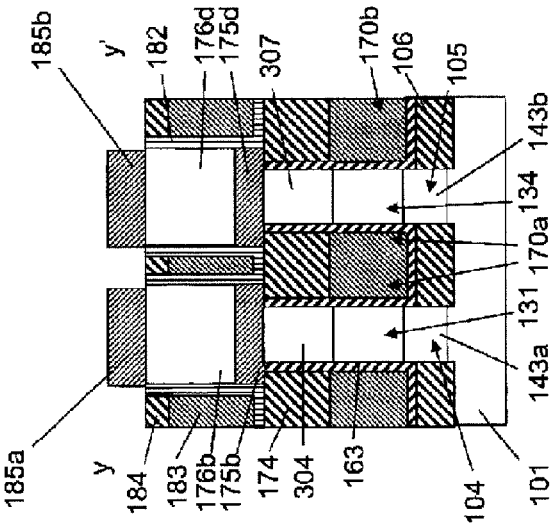
FIG. 1B is a cross-sectional view taken along line x-x' in FIG. 1A.

As shown in FIGS. 1A to 1C, memory cells, which are each a semiconductor device according to the present invention, are placed in the first row of the first column, the first row of the third column, the second row of the first column, and the second row of the third column. Contact devices each having a contact electrode and a contact line for connecting source lines to each other are placed in the first row of the second column and in the second row of the second column.

The memory cell in the second row of the first column includes a fin-shaped semiconductor layer 104 formed on a semiconductor substrate 101, a first insulating film 106 formed around the fin-shaped semiconductor layer 104, a first pillar-shaped semiconductor layer 129 formed on the fin-shaped semiconductor layer 104, a gate insulating film 162 formed around the first pillar-shaped semiconductor layer 129, a gate electrode 168a formed of a metal formed around the gate insulating film 162, a gate line 168b formed of a metal connected to the gate electrode 168a, the gate insulating film 162 formed around and at bottoms of the gate electrode 168a and the gate line 168b, a first diffusion layer 302 formed in an upper portion of the first pillar-shaped semiconductor layer 129, and a second diffusion layer 143a formed in a lower portion of the first pillar-shaped semiconductor layer 129. The width of the first pillar-shaped semiconductor layer 129 in a direction perpendicular to the direction in which the fin-shaped semiconductor layer 104 extends is equal to the width of the fin-shaped semiconductor layer 104 in the direction perpendicular to the direction in which the fin-shaped semiconductor layer 104 extends. The gate line 168b extends in a direction perpendicular to the direction in which the fin-shaped semiconductor layer 104 extends. The outer width of the gate electrode 168a is equal to the width of the gate line 168b. The second diffusion layer 143a is also formed in the fin-shaped semiconductor layer 104.

The memory cell further includes a lower electrode 175a, a pillar-shaped phase change layer 176a, a reset gate insulating film 182, and a reset gate 183 on or above the first diffusion layer 302.

The memory cell in the second row of the third column includes the fin-shaped semiconductor layer 104 formed on the semiconductor substrate 101, the first insulating film 106 formed around the fin-shaped semiconductor layer 104, a first pillar-shaped semiconductor layer 131 formed on the fin-shaped semiconductor layer 104, a gate insulating film 163 formed around the first pillar-shaped semiconductor layer 131, a gate electrode 170a formed of a metal formed around the gate insulating film 163, a gate line 170b formed of a metal connected to the gate electrode 170a, the gate insulating film 163 formed around and at bottoms of the gate electrode 170a and the gate line 170b, a first diffusion layer 304 formed in an upper portion of the first pillar-shaped semiconductor layer 131, and the second diffusion layer 143a formed in a lower portion of the first pillar-shaped semiconductor layer 131. The width of the first pillar-shaped semiconductor layer 131 in a direction perpendicular to the direction in which the fin-shaped semiconductor layer 104 extends is equal to the width of the fin-shaped semiconductor layer 104 in the direction perpendicular to the direction in which the fin-shaped semiconductor layer 104 extends. The gate line 170b extends in the direction perpendicular to the direction in which the fin-shaped semiconductor layer 104 extends. The outer width of the gate electrode 170a is equal to the width of the gate line 170b. The second diffusion layer 143a is also formed in the fin-shaped semiconductor layer 104.

The memory cell further includes a lower electrode 175b, a pillar-shaped phase change layer 176b, the reset gate insulating film 182, and the reset gate 183 disposed on or above the first diffusion layer 304.

An upper portion of the pillar-shaped phase change layer 176a is connected to an upper portion of the pillar-shaped phase change layer 176b via a bit line 185a.

The memory cell in the first row of the first column includes a fin-shaped semiconductor layer 105 formed on the semiconductor substrate 101, the first insulating film 106 formed around the fin-shaped semiconductor layer 105, a first pillar-shaped semiconductor layer 132 formed on the fin-shaped semiconductor layer 105, the gate insulating film 162 formed around the first pillar-shaped semiconductor layer 132, the gate electrode 168a formed of a metal formed around the gate insulating film 162, the gate line 168b formed of a metal connected to the gate electrode 168a, the gate insulating film 162 formed around and at bottoms of the gate electrode 168a and the gate line 168b, a first diffusion layer 305 formed in an upper portion of the first pillar-shaped semiconductor layer 132, and a second diffusion layer 143b formed in a lower portion of the first pillar-shaped semiconductor layer 132. The width of the first pillar-shaped semiconductor layer 132 in a direction perpendicular to the direction in which the fin-shaped semiconductor layer 105 extends is equal to the width of the fin-shaped semiconductor layer 105 in the direction perpendicular to the direction in which the fin-shaped semiconductor layer 105 extends. The gate line 168b extends in a direction perpendicular to the direction in which the fin-shaped semiconductor layer 105 extends. The outer width of the gate electrode 168a is equal to the width of the gate line 168b. The second diffusion layer 143b is also formed in the fin-shaped semiconductor layer 105.

The memory cell further includes a lower electrode 175c, a pillar-shaped phase change layer 176c, the reset gate insulating film 182, and the reset gate 183 disposed on or above the first diffusion layer 305.

The memory cell in the first row of the third column includes the fin-shaped semiconductor layer 105 formed on the semiconductor substrate 101, the first insulating film 106 formed around the fin-shaped semiconductor layer 105, a first pillar-shaped semiconductor layer 134 formed on the fin-shaped semiconductor layer 105, the gate insulating film 163 formed around the first pillar-shaped semiconductor layer 134, the gate electrode 170a formed of a metal formed around the gate insulating film 163, the gate line 170b formed of a metal connected to the gate electrode 170a, the gate insulating film 163 formed around and at bottoms of the gate electrode 170a and the gate line 170b, a first diffusion layer 307 formed in an upper portion of the first pillar-shaped semiconductor layer 134, and the second diffusion layer 143b formed in a lower portion of the first pillar-shaped semiconductor layer 134. The width of the first pillar-shaped semiconductor layer 134 in a direction perpendicular to the direction in which the fin-shaped semiconductor layer 105 extends is equal to the width of the fin-shaped semiconductor layer 105 in the direction perpendicular to the direction in which the fin-shaped semiconductor layer 105 extends. The gate line 170b extends in a direction perpendicular to the direction in which the fin-shaped semiconductor layer 105 extends. The outer width of the gate electrode 170a is equal to the width of the gate line 170b. The second diffusion layer 143b is also formed in the fin-shaped semiconductor layer 105.

The memory cell further includes a lower electrode 175d, a pillar-shaped phase change layer 176d, the reset gate insulating film 182, and the reset gate 183 disposed on or above the first diffusion layer 307.

The pillar-shaped phase change layer 176c is connected to the pillar-shaped phase change layer 176d via a bit line 185b.

In sum, memory elements that include pillar-shaped phase change layers 176a, 176b, 176c, and 176d, the reset gate insulating film 182 surrounding the pillar-shaped phase change layers, and the reset gate 183 surrounding the reset gate insulating film 182 are arranged in two or more rows and two or more columns. The reset gate 183 provides connection in the row direction and the column direction and functions as a heater. When current is supplied to the reset gate 183, the reset gate 183 functions as a heater and generates heat which melts the chalcogenide glass (GST: $Ge_2Sb_2Te_5$) in contact with this heater and thereby induces phase transition. The memory elements in two or more rows and two or more columns can be reset at once.

Since the gate electrodes 168*a* and 170*a* are formed of a metal and the gate lines 168*b* and 170*b* are formed of a metal, cooling can be accelerated. Since the gate insulating films 162 and 163 formed around and at bottoms of the gate electrodes 168*a* and 170*a* and the gate lines are provided, metal gates are formed by a gate-last process. Thus, the metal gate process and the high-temperature process can be both employed.

The gate insulating films 162 and 163 are formed around and at bottoms of the gate electrodes 168*a* and 170*a* and the gate lines 168*b* and 170*b*; the gate electrodes 168*a* and 170*a* are formed of a metal; the gate lines 168*b* and 170*b* are formed of a metal; the gate lines 168*b* and 170*b* extend in a direction perpendicular to a direction in which the fin-shaped semiconductor layers 104 and 105 extend; the second diffusion layers 143*a* and 143*b* are also formed in the fin-shaped semiconductor layers 104 and 105; the outer width of the gate electrodes 168*a* and 170*a* is equal to the width of the gate lines 168*b* and 170*b*; and the width of the first pillar-shaped semiconductor layers 129, 131, 132, and 134 is equal to the width of the fin-shaped semiconductor layers 104 and 105. Due to these features, the fin-shaped semiconductor layers 104 and 105, the first pillar-shaped semiconductor layers 129, 131, 132, and 134, the gate electrodes 168*a* and 170*a*, and the gate lines 168*b* and 170*b* of this semiconductor device are formed by self-alignment using two masks. Thus, the number of steps can be reduced.

The contact device in the second row of the second column includes the fin-shaped semiconductor layer 104 formed on the semiconductor substrate 101, the first insulating film 106 formed around the fin-shaped semiconductor layer 104, a second pillar-shaped semiconductor layer 130 formed on the fin-shaped semiconductor layer 104, a contact electrode 169*a* formed of a metal formed around the second pillar-shaped semiconductor layer 130, a gate insulating film 165 formed between the second pillar-shaped semiconductor layer 130 and the contact electrode 169*a*, a contact line 169*b* connected to the contact electrode 169*a* and formed of a metal extending in a direction perpendicular to the direction in which the fin-shaped semiconductor layer 104 extends, a gate insulating film 164 formed around the contact electrode 169*a* and the contact line 169*b*, and the second diffusion layer 143*a* formed in the fin-shaped semiconductor layer 104 and in a lower portion of the second pillar-shaped semiconductor layer 130. The width of the second pillar-shaped semiconductor layer 130 in a direction perpendicular to the direction in which the fin-shaped semiconductor layer 104 extends is equal to the width of the fin-shaped semiconductor layer 104 in the direction perpendicular to the direction in which the fin-shaped semiconductor layer 104 extends. The outer width of the contact electrode 169*a* is equal to the width of the contact line 169*b*. The contact electrode 169*a* is connected to the second diffusion layer 143*a*.

The contact device in the first row of the second column includes the fin-shaped semiconductor layer 105 formed on the semiconductor substrate 101, the first insulating film 106 formed around the fin-shaped semiconductor layer 105, a second pillar-shaped semiconductor layer 133 formed on the fin-shaped semiconductor layer 105, the contact electrode 169*a* formed of a metal formed around the second pillar-shaped semiconductor layer 133, a gate insulating film 166 formed between the second pillar-shaped semiconductor layer 133 and the contact electrode 169*a*, the contact line 169*b* connected to the contact electrode 169*a* and formed of a metal extending in a direction perpendicular to the direction in which the fin-shaped semiconductor layer 105 extends, the gate insulating film 164 formed around the contact electrode 169*a* and the contact line 169*b*, and the second diffusion layer 143*b* formed in the fin-shaped semiconductor layer 105 and in a lower portion of the second pillar-shaped semiconductor layer 133. The width of the second pillar-shaped semiconductor layer 133 in a direction perpendicular to the direction in which the fin-shaped semiconductor layer 105 extends is equal to the width of the fin-shaped semiconductor layer 105 in the direction perpendicular to the direction in which the fin-shaped semiconductor layer 105 extends. The outer width of the contact electrode 169*a* is equal to the width of the contact line 169*b*. The contact electrode 169*a* is connected to the second diffusion layer 143*b*.

Since the contact line 169*b* is parallel to the gate lines 168*b* and 170*b* and connected to the second diffusion layers 143*a* and 143*b*, the second diffusion layers 143*a* and 143*b* are connected to each other and thus the resistance of the source line can be decreased and the increase in source voltage caused by current at the time of the set operation can be reduced. The contact line 169*b* parallel to the gate lines 168*b* and 170*b* is preferably provided one for each two, four, eight, sixteen, thirty-two, or sixty-four memory cells arranged in one column in the direction of the bit lines 185*a* and 185*b*, for example.

The structure formed by the second pillar-shaped semiconductor layers 130 and 133, and the contact electrodes 169*a* and the contact line 169*b* formed around the second pillar-shaped semiconductor layers 130 and 133 is identical to the transistor structure except that the contact electrodes 169*a* are connected to the second diffusion layers 143*a* and 143*b*. All source lines formed of the second diffusion layers 143*a* and 143*b* parallel to the gate lines 168*b* and 170*b* are connected to the contact line 169*b*. Thus, the number of steps can be reduced.

FIGS. 2A to 2C show a structure in which a second diffusion layer 143*c* is formed down to a deeper position in the semiconductor substrate 101 so that the second diffusion layers 143*a* and 143*b* shown in FIGS. 1A to 1C are connected into one layer. According to this structure, the source resistance can be further reduced.

FIGS. 3A to 3C show a structure obtained by omitting the fin-shaped semiconductor layer 105 and the first insulating film 106 formed around the fin-shaped semiconductor layer 105 from the structure shown in FIGS. 2A to 2C and forming a second diffusion layer 143*d* on the semiconductor substrate 101. According to this structure, the source resistance can be further reduced.

The steps for producing a semiconductor device structure according to an embodiment of the present invention will now be described with reference to FIGS. 4A to 48C.

To begin with, a first step of forming fin-shaped semiconductor layers on a semiconductor substrate and forming a first insulating film around the fin-shaped semiconductor layers is described. In this embodiment, a silicon substrate is used; alternatively, the substrate may be composed of any semiconductor other than silicon.

Figure 4A:
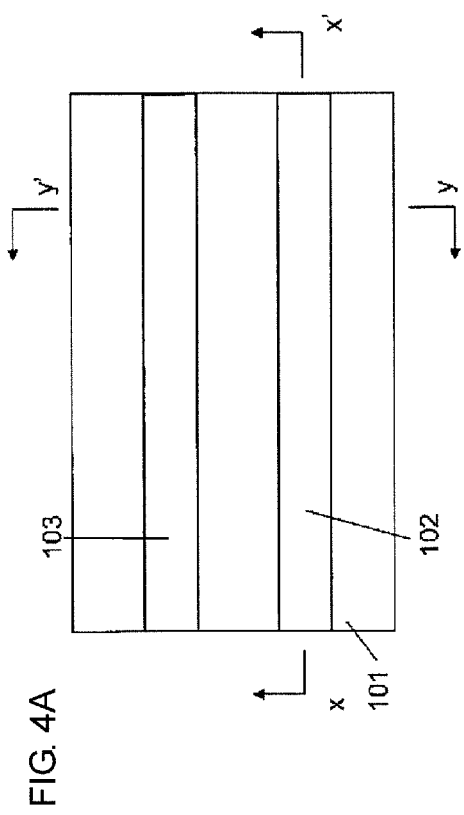
FIG. 4A is a plan view related to a method for producing a memory device according to the present invention.
Figure 4C:
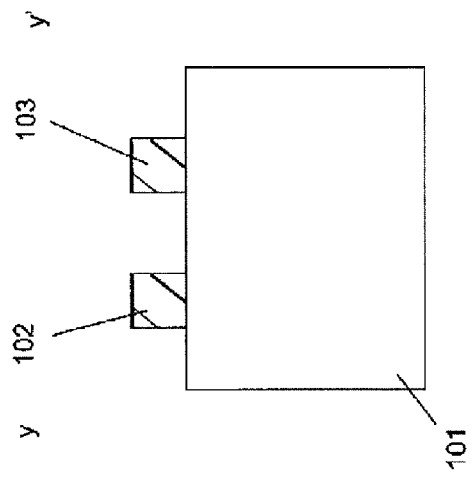
FIG. 4C is a cross-sectional view taken along line y-y' in FIG. 4A.
Figure 4B:
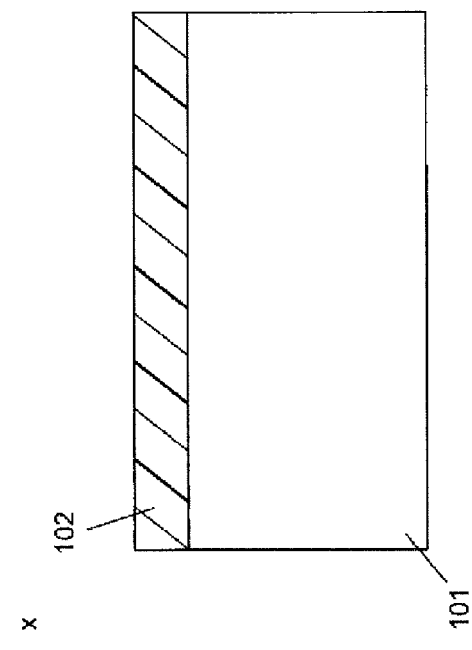
FIG. 4B is a cross-sectional view taken along line x-x' in FIG. 4A.

Referring to FIGS. 4A to 4C, first resists 102 and 103 for forming fin-shaped silicon layers are formed on a semiconductor substrate 101.

Referring to FIGS. 5A to 5C, the semiconductor substrate 101 is etched to form fin-shaped silicon layers 104 and 105. Alternatively, a hard mask such as an oxide film or a nitride film may be used to form the fin-shaped silicon layers instead of the resist mask used in this embodiment.

Figure 6C:
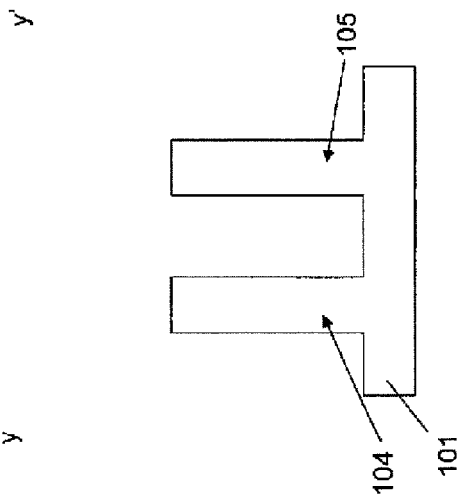
FIG. 6C is a cross-sectional view taken along line y-y' in FIG. 6A.
Figure 6A:
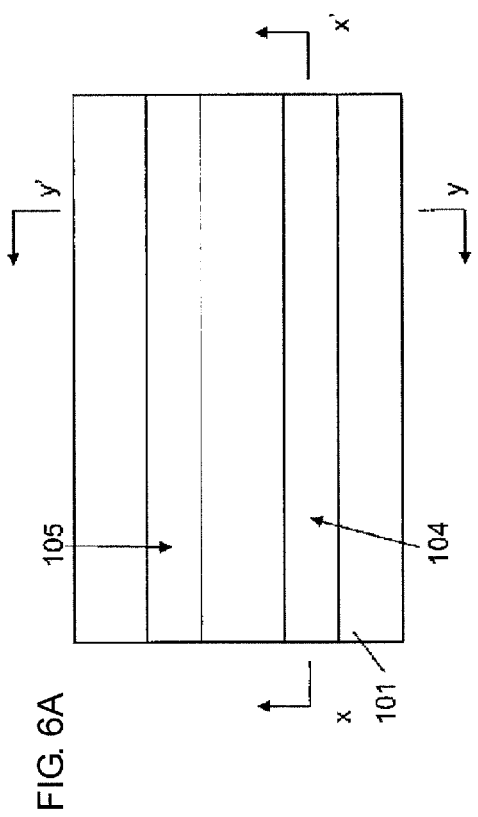
FIG. 6A is a plan view related to the method for producing a memory device according to the present invention.
Figure 6B:
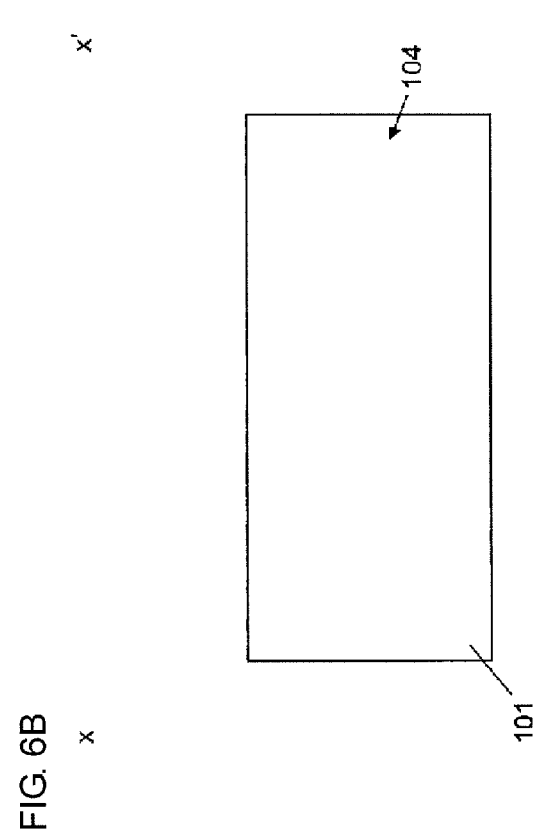
FIG. 6B is a cross-sectional view taken along line x-x' in FIG. 6A.

Referring to FIGS. 6A to 6C, the first resists 102 and 103 are removed.

Referring to FIGS. 7A to 7C, a first insulating film 106 is deposited around the fin-shaped silicon layers 104 and 105. The first insulating film may be an oxide film formed by a high-density plasma process or an oxide film formed by low-pressure chemical vapor deposition (CVD).

Referring to FIGS. 8A to 8C, the first insulating film 106 is etched back to expose upper portions of the fin-shaped silicon layers 104 and 105.

The description up to this paragraph is the description of the first step of forming fin-shaped semiconductor layers on a semiconductor substrate and forming a first insulating film around the fin-shaped semiconductor layers.

Next, a second step following the first step is described. The second step includes forming a second insulating film around the fin-shaped semiconductor layers, depositing and planarizing a first polysilicon on the second insulating film, forming a second resist for forming gate lines, first pillar-shaped semiconductor layers, second pillar-shaped semiconductor layers, and a contact line so that the second resist extends in a direction perpendicular to a direction in which the fin-shaped semiconductor layers extend, and etching the first polysilicon, the second insulating film, and the fin-shaped semiconductor layers so as to form first pillar-shaped semiconductor layers, first dummy gates formed of the first polysilicon, second pillar-shaped semiconductor layers, and second dummy gates formed of the first polysilicon.

Referring now to FIGS. 9A to 9C, second insulating films 107 and 108 are formed around the fin-shaped silicon layers 104 and 105. The second insulating films 107 and 108 are preferably oxide films.

Referring to FIGS. 10A to 10C, a first polysilicon 109 is deposited on the second insulating films 107 and 108 and the deposited first polysilicon 109 is planarized.

Figure 11A:
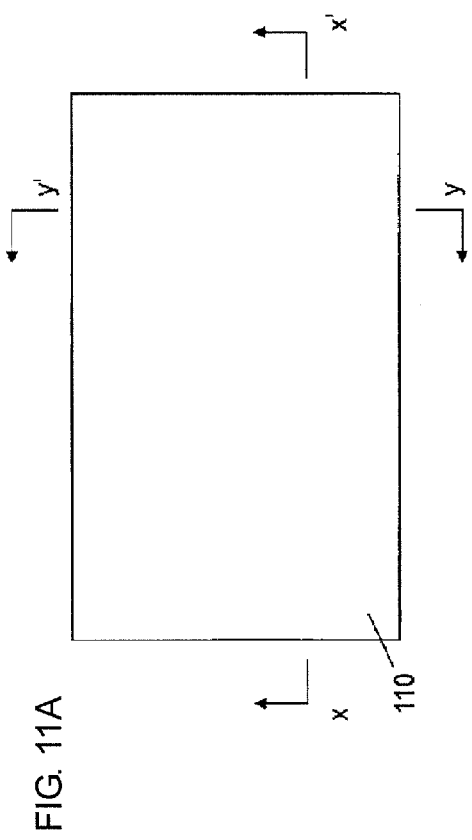
FIG. 11A is a plan view related to the method for producing a memory device according to the present invention.
Figure 11C:
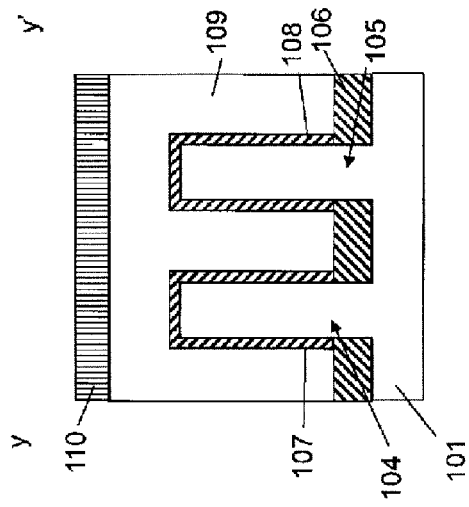
FIG. 11C is a cross-sectional view taken along line y-y' in FIG. 11A.
Figure 11B:
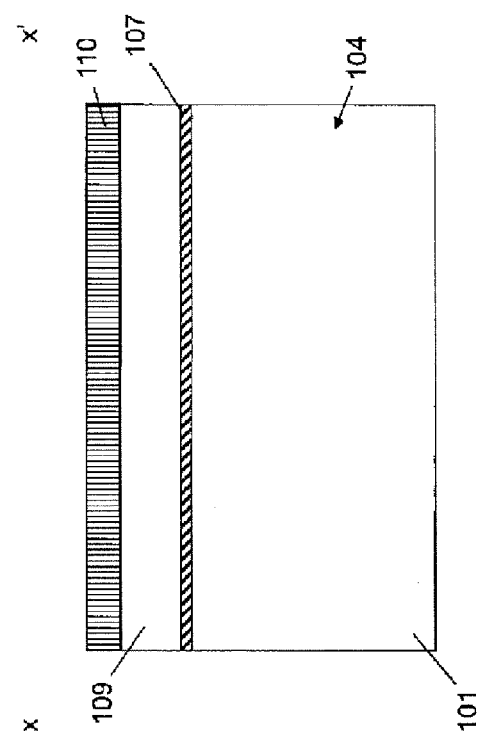
FIG. 11B is a cross-sectional view taken along line x-x' in FIG. 11A.

Referring to FIGS. 11A to 11C, a third insulating film 110 is formed on the first polysilicon 109. The third insulating film 110 is preferably a nitride film.

Figure 12A:
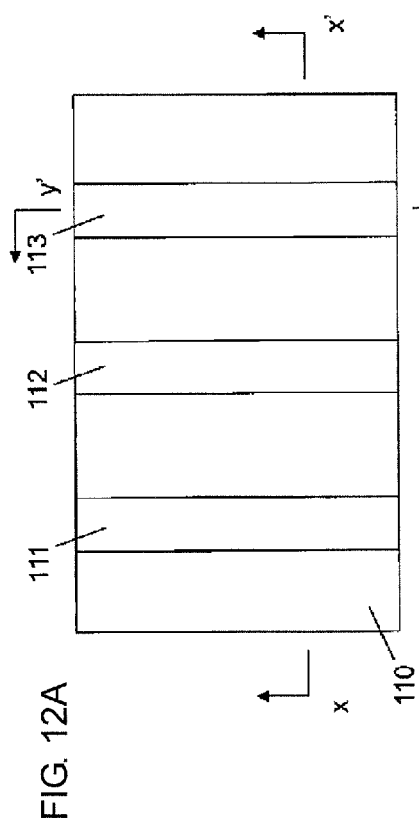
FIG. 12A is a plan view related to the method for producing a memory device according to the present invention.
Figure 12B:
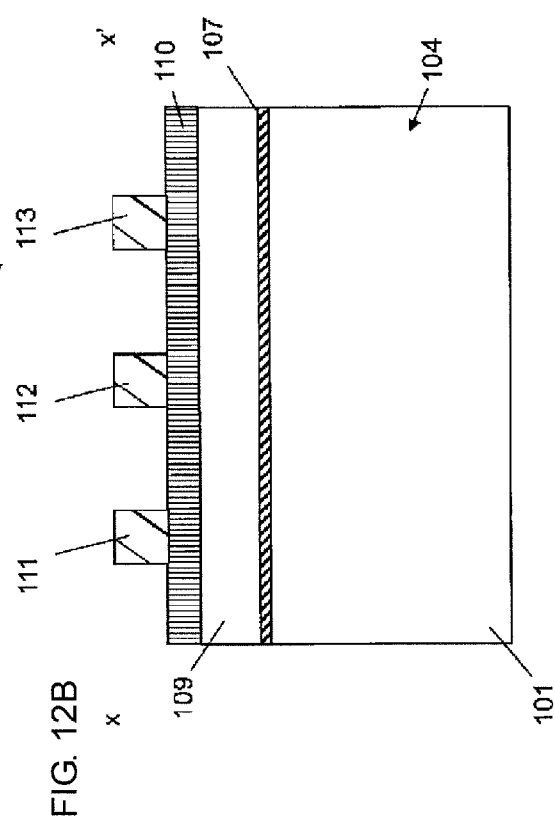
FIG. 12B is a cross-sectional view taken along line x-x' in FIG. 12A.
Figure 12C:
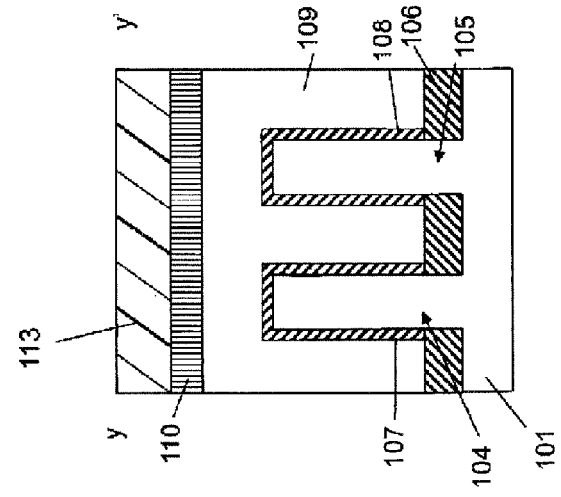
FIG. 12C is a cross-sectional view taken along line y-y' in FIG. 12A.

Referring to FIGS. 12A to 12C, second resists 111, 112, and 113 for forming gate lines 168b and 170b, first pillar-shaped semiconductor layers 129, 131, 132, and 134, second pillar-shaped semiconductor layers 130 and 133, and a contact line 169b are formed in a direction perpendicular to the direction in which the fin-shaped silicon layers 104 and 105 extend.

Referring to FIGS. 13A to 13C, the third insulating film 110, the first polysilicon 109, the second insulating films 107 and 108, and the fin-shaped silicon layers 104 and 105 are etched to form first pillar-shaped silicon layers 129, 131, 132, and 134, first dummy gates 117 and 119 formed of the first polysilicon, second pillar-shaped silicon layers 130 and 133, and a second dummy gate 118 formed of the first polysilicon. During this process, the third insulating film 110 is divided into third insulating films 114, 115, and 116. Moreover, the second insulating films 107 and 108 are divided into second insulating films 123, 124, 125, 126, 127, and 128. If the second resists 111, 112, and 113 are removed during the process of etching, the third insulating films 114, 115, and 116 serve as a hard mask. There is no need to use third insulating films if the second resists are not removed by etching.

Figure 14C:
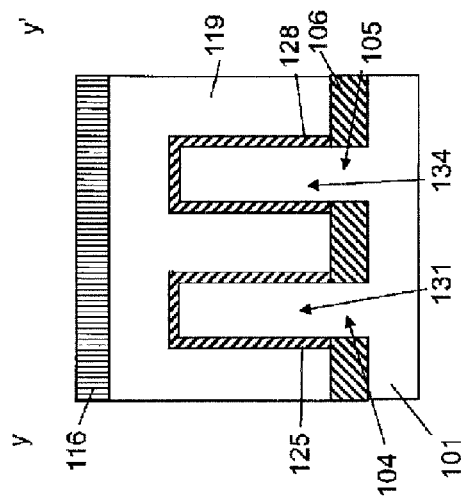
FIG. 14C is a cross-sectional view taken along line y-y' in FIG. 14A.
Figure 14A:
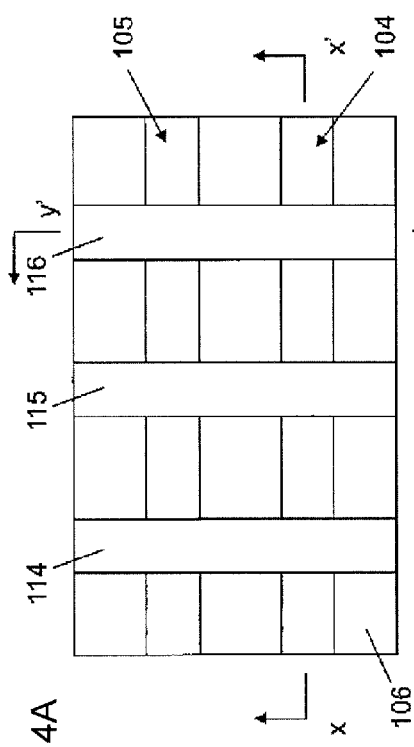
FIG. 14A is a plan view related to the method for producing a memory device according to the present invention.
Figure 14B:
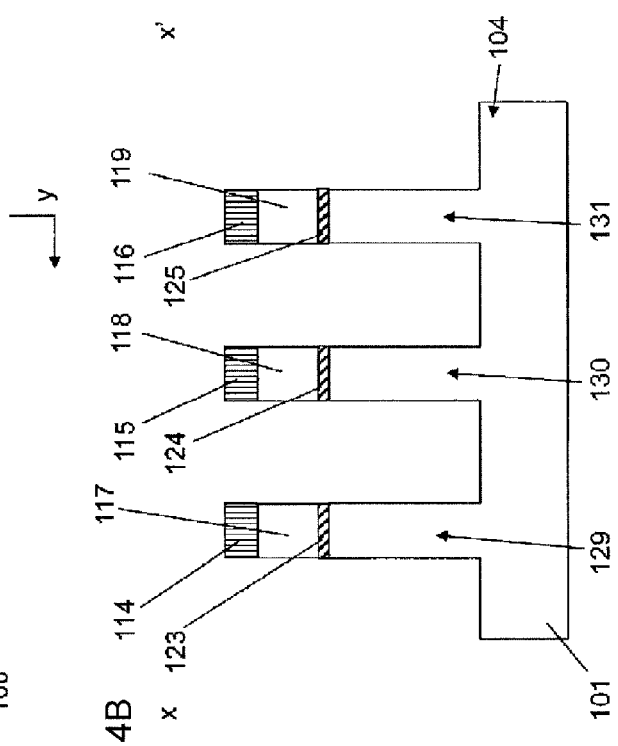
FIG. 14B is a cross-sectional view taken along line x-x' in FIG. 14A.

Referring to FIGS. 14A to 14C, the second resists 114, 115, and 116 are removed.

The description up to this paragraph is the description of the second step following the first step, the second step including forming a second insulating film around the fin-shaped semiconductor layers, depositing and planarizing a first polysilicon on the second insulating film, forming a second resist for forming gate lines, first pillar-shaped semiconductor layers, second pillar-shaped semiconductor layers, and a contact line so that the second resist extends in a direction perpendicular to a direction in which the fin-shaped semiconductor layers extend, and etching the first polysilicon, the second insulating film, and the fin-shaped semiconductor layers so as to form first pillar-shaped semiconductor layers, first dummy gates formed of the first polysilicon, second pillar-shaped semiconductor layers, and second dummy gates formed of the first polysilicon.

Next, a third step following the second step is described. The third step includes forming a fourth insulating film around the first pillar-shaped semiconductor layers, the second pillar-shaped semiconductor layers, the first dummy gates, and the second dummy gates, depositing a second polysilicon around the fourth insulating film, and etching the second polysilicon so as to allow the second polysilicon to remain on side walls of the first dummy gates, the first pillar-shaped semiconductor layers, the second dummy gates, and the second pillar-shaped semiconductor layers so as to form third dummy gates and fourth dummy gates.

Figure 15A:
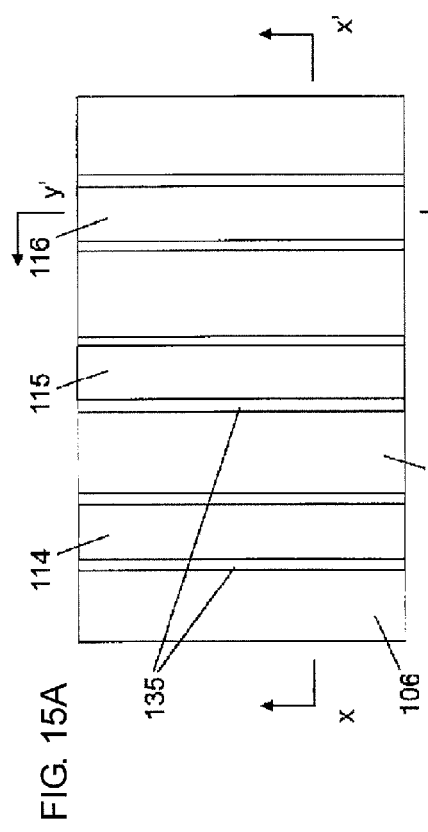
FIG. 15A is a plan view related to the method for producing a memory device according to the present invention.
Figure 15B:
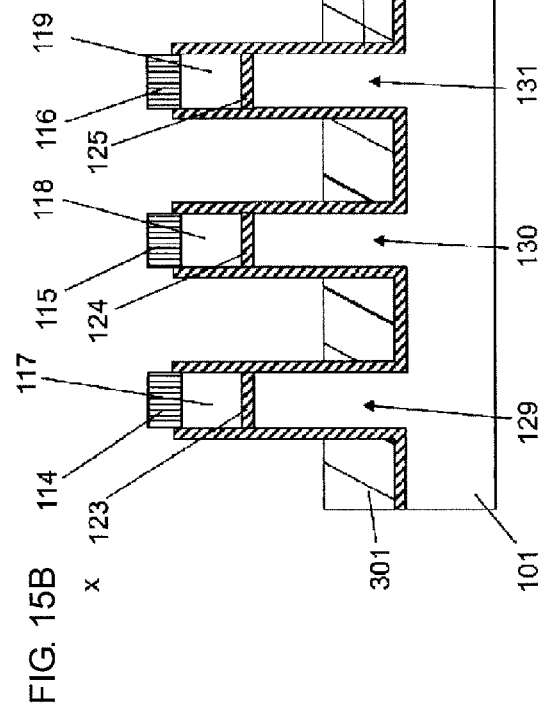
FIG. 15B is a cross-sectional view taken along line x-x' in FIG. 15A.
Figure 15C:
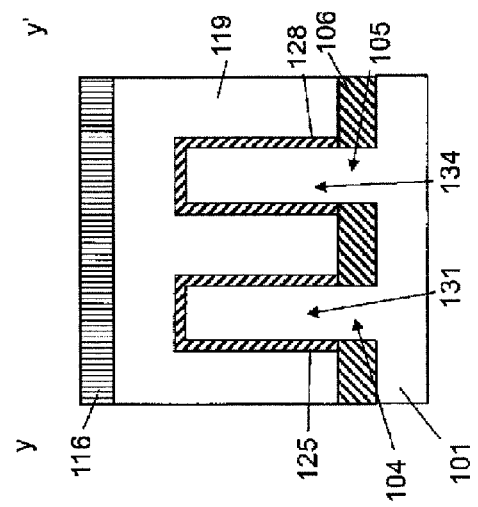
FIG. 15C is a cross-sectional view taken along line y-y' in FIG. 15A.

Referring to FIGS. 15A to 15C, a fourth insulating film 135 is formed around the first pillar-shaped silicon layers 129, 131, 132, and 134, the second pillar-shaped silicon layers 130 and 133, the first dummy gates 117 and 119, and the second dummy gate 118. The fourth insulating film 135 is preferably an oxide film. A third resist 301 is formed and etching-back is performed so as to expose upper portions of the first pillar-shaped silicon layers 129, 131, 132, and 134. During this process, upper portions of the second pillar-shaped silicon layers 130 and 133 may also be exposed.

Figure 16A:
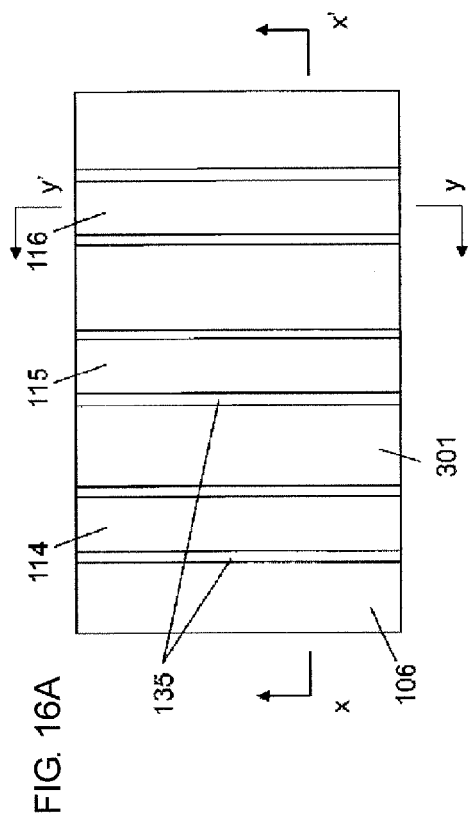
FIG. 16A is a plan view related to the method for producing a memory device according to the present invention.
Figure 16C:
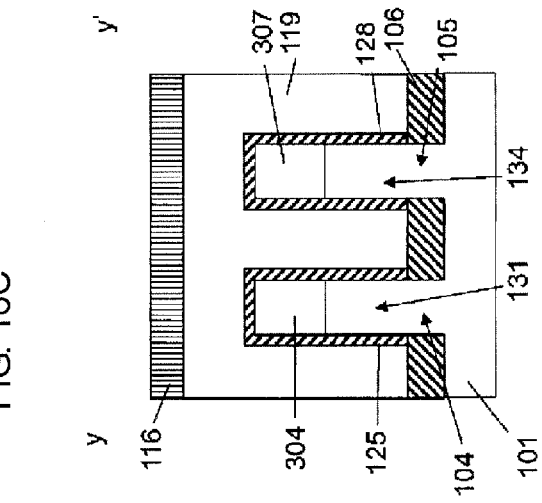
FIG. 16C is a cross-sectional view taken along line y-y' in FIG. 16A.
Figure 16B:
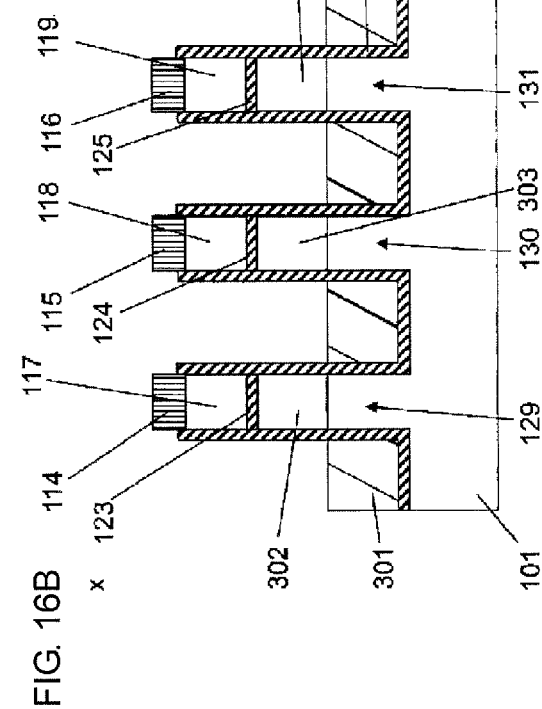
FIG. 16B is a cross-sectional view taken along line x-x' in FIG. 16A.

Referring to FIGS. 16A to 16C, an impurity is introduced so as to form first diffusion layers 302, 304, 305, and 307 in upper portions of the first pillar-shaped silicon layers 129, 131, 132, and 134. First diffusion layers 303 and 306 may be formed in upper portions of the second pillar-shaped silicon layers 130 and 133. To form n-type diffusion layers, arsenic or phosphorus is preferably introduced. To form p-type diffusion layers, boron is preferably introduced.

Figure 17A:
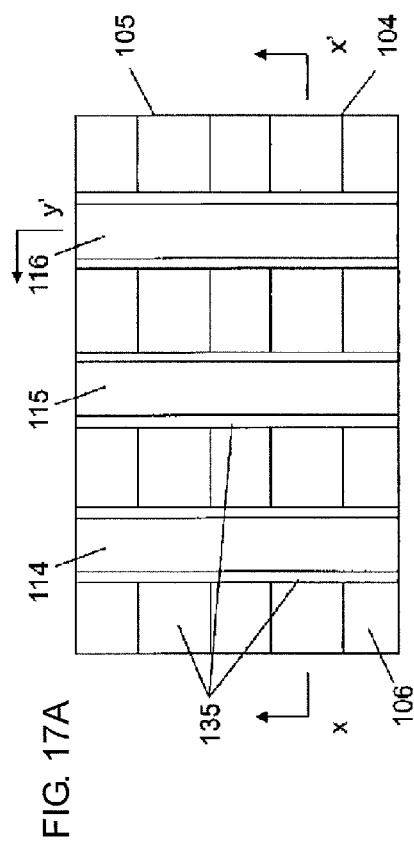
FIG. 17A is a plan view related to the method for producing a memory device according to the present invention.
Figure 17C:
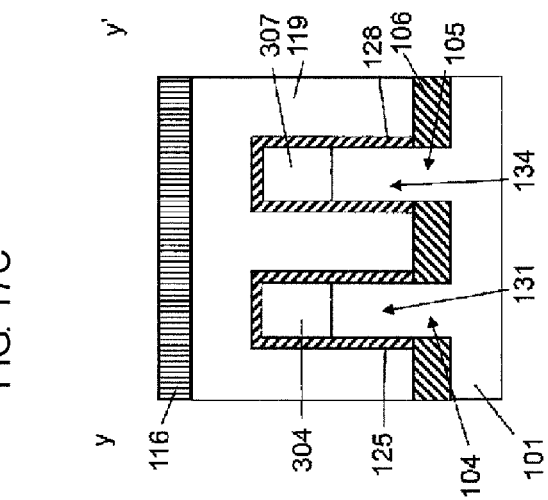
FIG. 17C is a cross-sectional view taken along line y-y' in FIG. 17A.
Figure 17B:
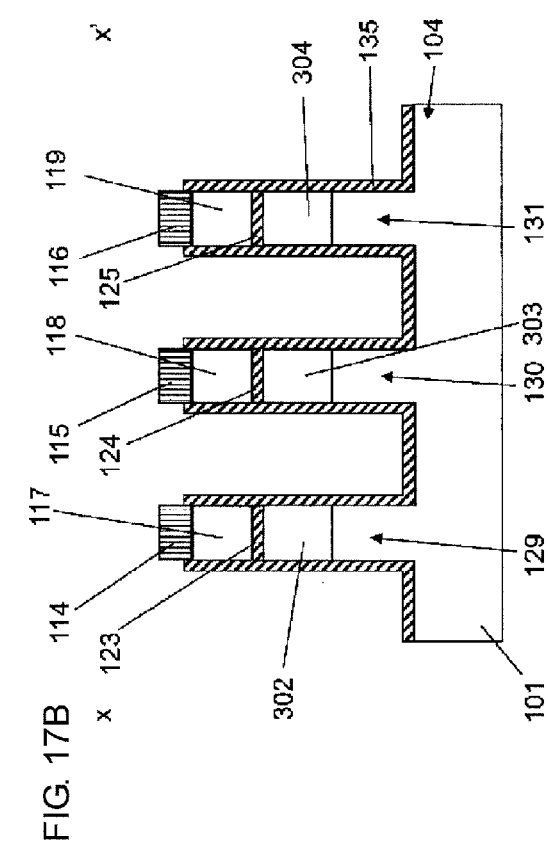
FIG. 17B is a cross-sectional view taken along line x-x' in FIG. 17A.

Referring to FIGS. 17A to 17C, the third resist 301 is removed.

Referring to FIGS. 18A to 18C, a second polysilicon 136 is deposited around the fourth insulating film 135.

Figure 19A:
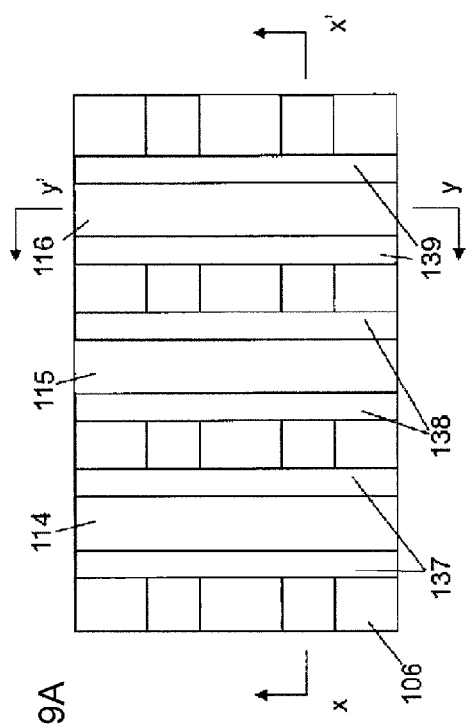
FIG. 19A is a plan view related to the method for producing a memory device according to the present invention.
Figure 19C:
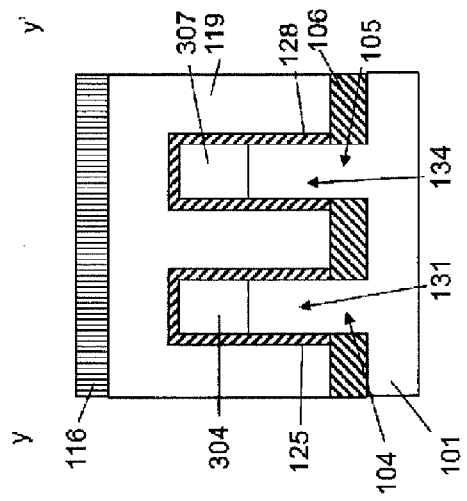
FIG. 19C is a cross-sectional view taken along line y-y' in FIG. 19A.
Figure 19B:
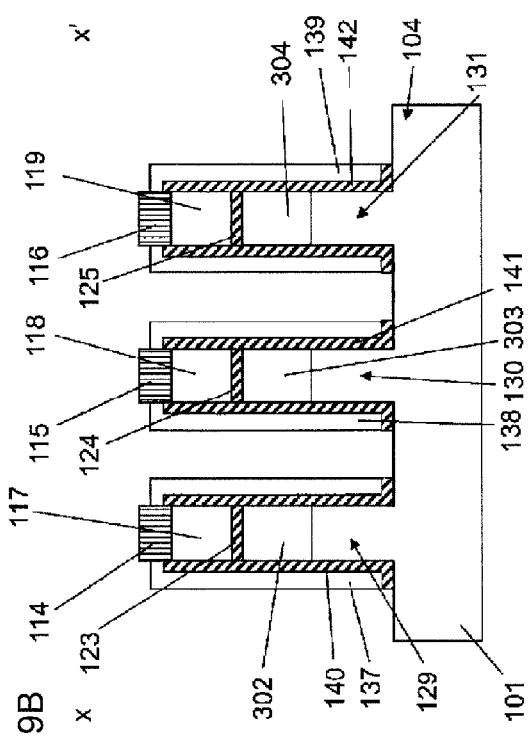
FIG. 19B is a cross-sectional view taken along line x-x' in FIG. 19A.

Referring to FIGS. 19A to 19C, the second polysilicon 136 is etched so that the second polysilicon 136 remains on the side walls of the first dummy gates 117 and 119, the first pillar-shaped silicon layers 129, 131, 132, and 134, the second dummy gate 118, and the second pillar-shaped silicon layers 130 and 133, and forms third dummy gates 137 and 139 and a fourth dummy gate 138. During this process, the fourth insulating film 135 may be divided into fourth insulating films 140, 141, and 142.

The description up to this paragraph is the description of the third step following the second step, the third step including forming a fourth insulating film around the first pillar-shaped semiconductor layers, the second pillar-shaped semiconductor layers, the first dummy gates, and the second dummy gates, depositing a second polysilicon around the fourth insulating film, and etching the second polysilicon so as to allow the second polysilicon to remain on side walls of the first dummy gates, the first pillar-shaped semiconductor layers, the second dummy gates, and the second pillar-shaped semiconductor layers so as to form third dummy gates and fourth dummy gates.

Next, a fourth step is described which includes forming second diffusion layers in upper portions of the fin-shaped semiconductor layers, lower portions of the first pillar-shaped semiconductor layers, and lower portions of the second pillar-shaped semiconductor layers, forming a fifth insulating film around the third dummy gates and the fourth dummy gates, etching the fifth insulating film into a side wall shape so as to form side walls formed of the fifth insulating film, and forming a metal-semiconductor compound on the second diffusion layers.

Figure 20C:
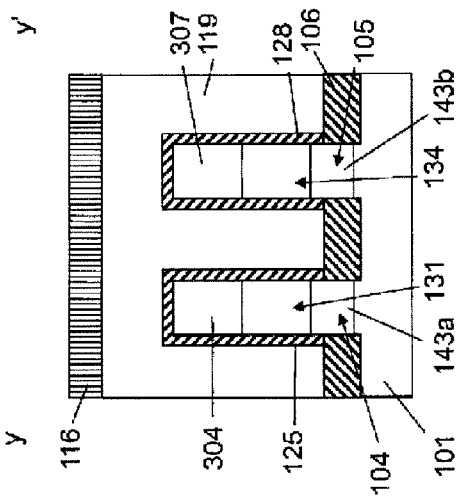
FIG. 20C is a cross-sectional view taken along line y-y' in FIG. 20A.
Figure 20A:
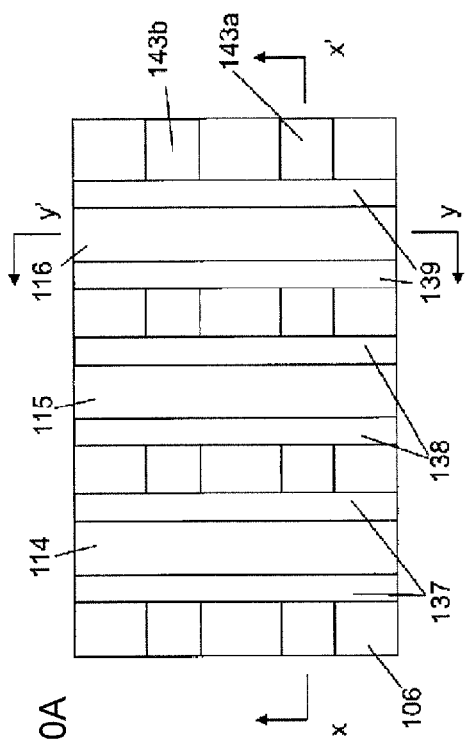
FIG. 20A is a plan view related to the method for producing a memory device according to the present invention.
Figure 20B:
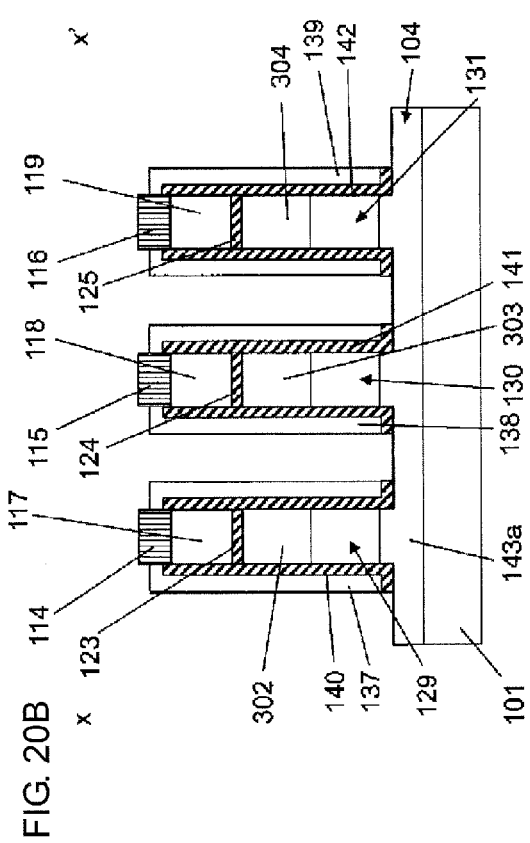
FIG. 20B is a cross-sectional view taken along line x-x' in FIG. 20A.

Referring to FIGS. 20A to 20C, an impurity is introduced to form second diffusion layers 143a and 143b in lower portions of the first pillar-shaped silicon layers 129, 131, 132, and 134 and in lower portions of the second pillar-shaped silicon layers 130 and 133. To form n-type diffusion layers, arsenic or phosphorus is preferably introduced. To form p-type diffusion layers, boron is preferably introduced. Alternatively, the diffusion layers may be formed after forming side walls formed of the fifth insulating film as described below.

Referring to FIGS. 21A to 21C, a fifth insulating film 144 is formed around the third dummy gates 137 and 139 and the fourth dummy gate 138. The fifth insulating film 144 is preferably a nitride film.

Figure 22C:
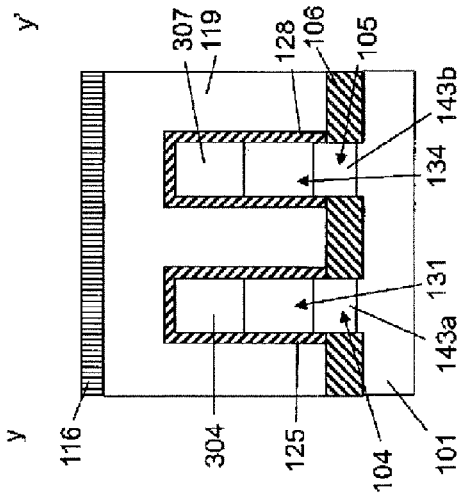
FIG. 22C is a cross-sectional view taken along line y-y' in FIG. 22A.
Figure 22A:
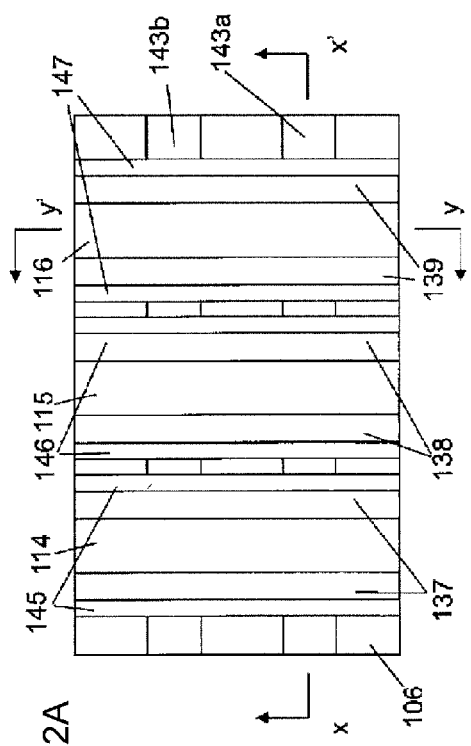
FIG. 22A is a plan view related to the method for producing a memory device according to the present invention.
Figure 22B:
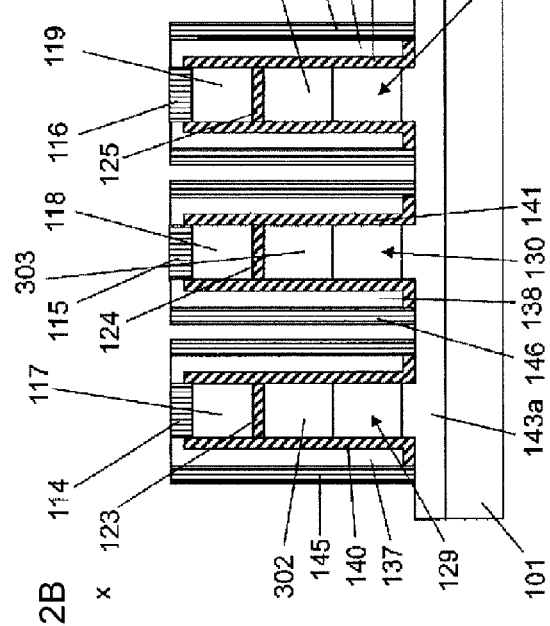
FIG. 22B is a cross-sectional view taken along line x-x' in FIG. 22A.

Referring to FIGS. 22A to 22C, the fifth insulating film 144 is etched into a side wall shape so that the remaining fifth insulating film 144 forms side walls 145, 146, and 147.

Referring to FIGS. 23A to 23C, metal-semiconductor compounds 148, 149, 150, 151, 152, 153, 154, and 155 are formed in upper portions of the second diffusion layers 143a and 143b. During this process, metal-semiconductor compounds 156, 158, and 157 are formed in upper portions of the third dummy gates 137 and 139 and in an upper portion of the fourth dummy gate 138.

The description up to this paragraph is the description of the fourth step including forming second diffusion layers in upper portions of the fin-shaped semiconductor layers, lower portions of the first pillar-shaped semiconductor layers, and lower portions of the second pillar-shaped semiconductor layers, forming a fifth insulating film around the third dummy gates and the fourth dummy gates, etching the fifth insulating film into a side wall shape so as to form side walls formed of the fifth insulating film, and forming a metal-semiconductor compound on the second diffusion layers.

Next, a fifth step following the fourth step is described. The fifth step includes depositing and planarizing an interlayer insulating film, exposing upper portions of the first dummy gates, the second dummy gates, the third dummy gates, and the fourth dummy gates, removing the first dummy gates, the second dummy gates, the third dummy gates, and the fourth dummy gates, removing the second insulating film and the fourth insulating film, forming a gate insulating film around the first pillar-shaped semiconductor layers, around the second pillar-shaped semiconductor layers, and on an inner side of the fifth insulating film, forming a fourth resist for removing the gate insulating film around bottom portions of the second pillar-shaped semiconductor layers, removing the gate insulating film around the bottom portions of the second pillar-shaped semiconductor layers, depositing a metal, and etching back the metal so as to form gate electrodes and gate lines around the first pillar-shaped semiconductor layers and form contact electrodes and a contact line around the second pillar-shaped semiconductor layers.

Figure 24C:
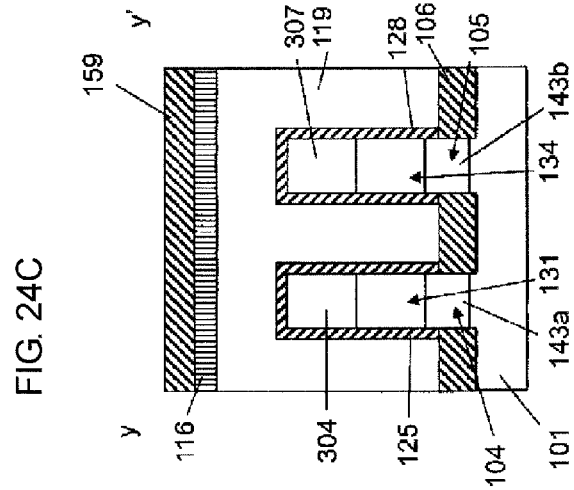
FIG. 24C is a cross-sectional view taken along line y-y' in FIG. 24A.
Figure 24A:
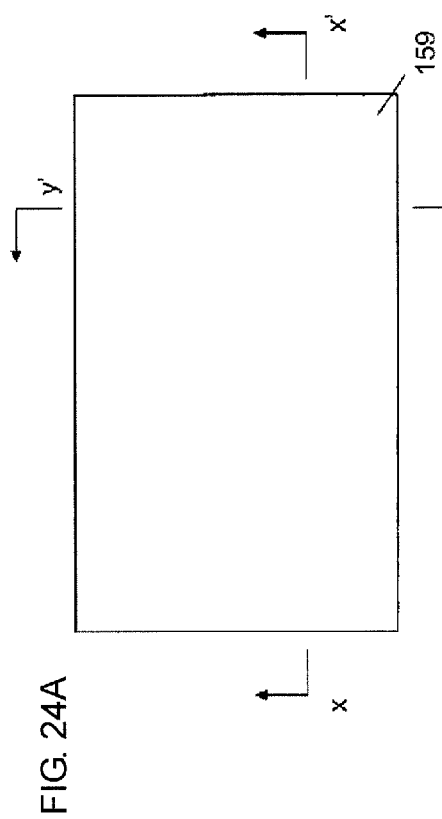
FIG. 24A is a plan view related to the method for producing a memory device according to the present invention.
Figure 24B:
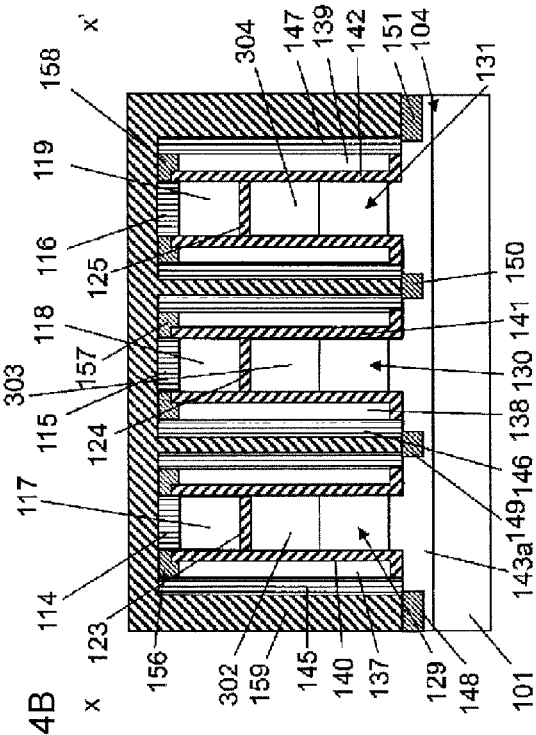
FIG. 24B is a cross-sectional view taken along line x-x' in FIG. 24A.

Referring to FIGS. 24A to 24C, an interlayer insulating film 159 is deposited. A contact stopper film may be used.

Figure 25C:
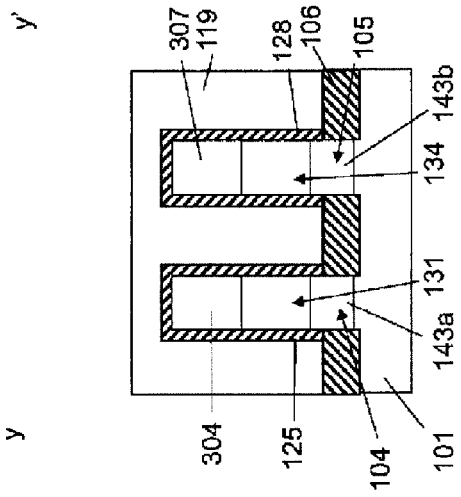
FIG. 25C is a cross-sectional view taken along line y-y' in FIG. 25A.
Figure 25A:
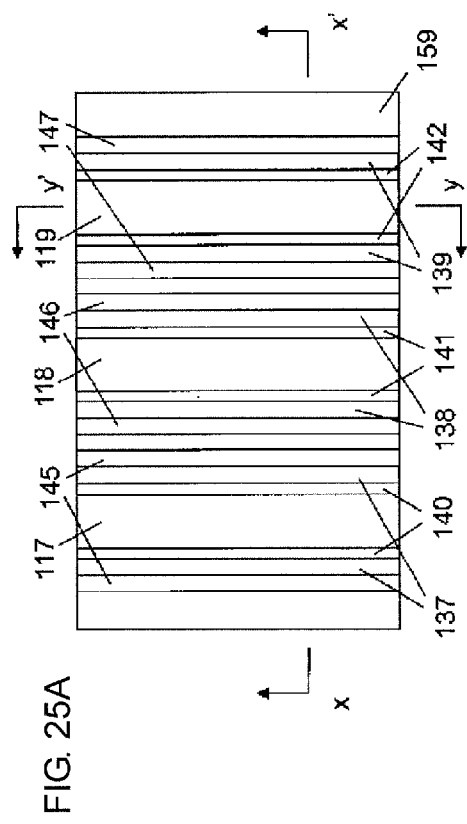
FIG. 25A is a plan view related to the method for producing a memory device according to the present invention.
Figure 25B:
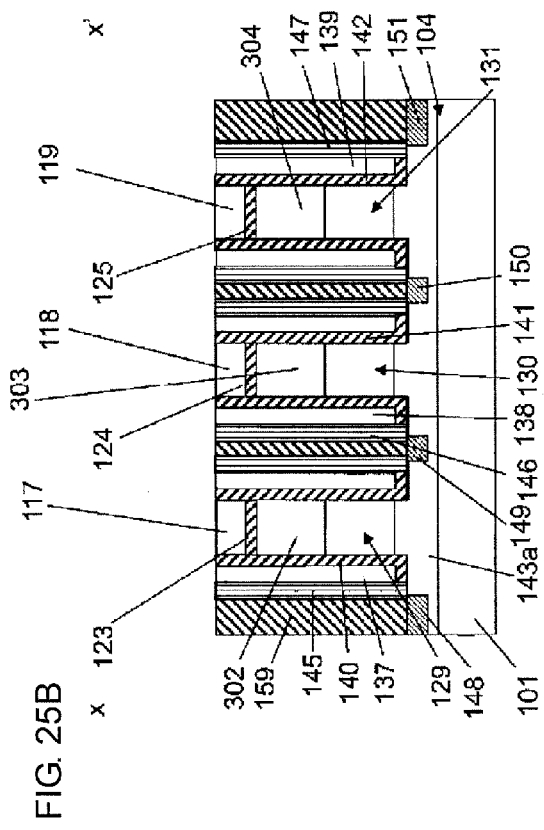
FIG. 25B is a cross-sectional view taken along line x-x' in FIG. 25A.

Referring to FIGS. 25A to 25C, chemical mechanical polishing is conducted to expose upper portions of the first dummy gates 117 and 119, the second dummy gate 118, the third dummy gates 137 and 139, and the fourth dummy gate 138. During this process, the metal-semiconductor compounds 156, 158, and 157 in the upper portions of the third dummy gates 137 and 139 and the fourth dummy gate 138 are removed.

Referring to FIGS. 26A to 26C, the first dummy gates 117 and 119, the second dummy gate 118, the third dummy gates 137 and 139, and the fourth dummy gate 138 are removed.

Referring to FIGS. 27A to 27C, the second insulating films 123, 124, 125, 126, 127, and 128 and the fourth insulating films 140, 141, and 142 are removed.

Referring to FIGS. 28A to 28C, a gate insulating film 160 is formed around the first pillar-shaped silicon layers 129, 131, 132, and 134, around the second pillar-shaped silicon layers 130 and 133, and on the inner sides of the fifth insulating films 145, 146, and 147.

Referring to FIGS. 29A to 29C, a fourth resist 161 for removing the gate insulating film 160 around the bottom portions of the second pillar-shaped silicon layers 130 and 133 is formed.

Figure 30C:
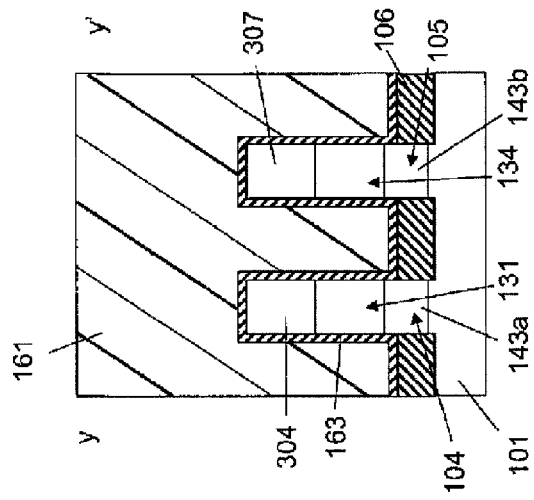
FIG. 30C is a cross-sectional view taken along line y-y' in FIG. 30A.
Figure 30A:
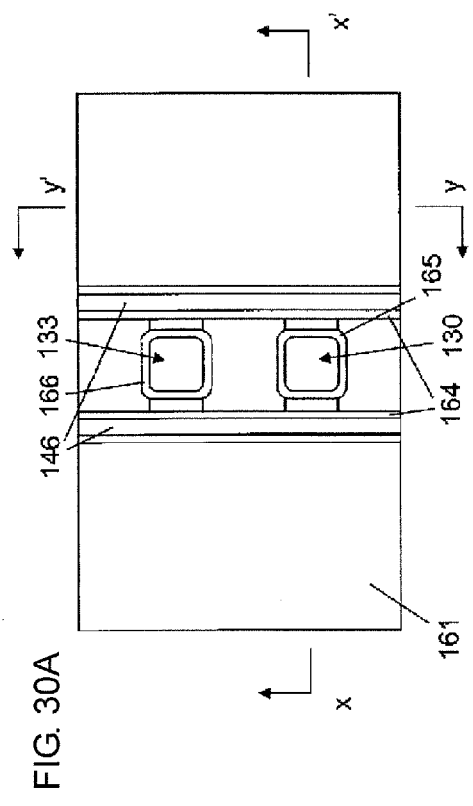
FIG. 30A is a plan view related to the method for producing a memory device according to the present invention.
Figure 30B:
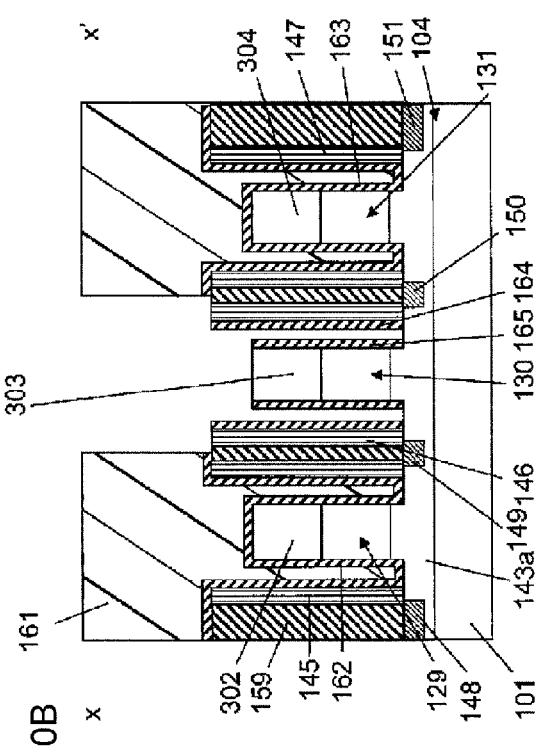
FIG. 30B is a cross-sectional view taken along line x-x' in FIG. 30A.

Referring to FIGS. 30A to 30C, the gate insulating film 160 around the bottom portions of the second pillar-shaped silicon layers 130 and 133 is removed. The gate insulating film is divided into gate insulating films 162, 163, 164, 165, and 166 as a result. The gate insulating films 164, 165, and 166 may be removed by isotropic etching.

Referring to FIGS. 31A to 31C, the fourth resist 161 is removed.

Figure 32A:
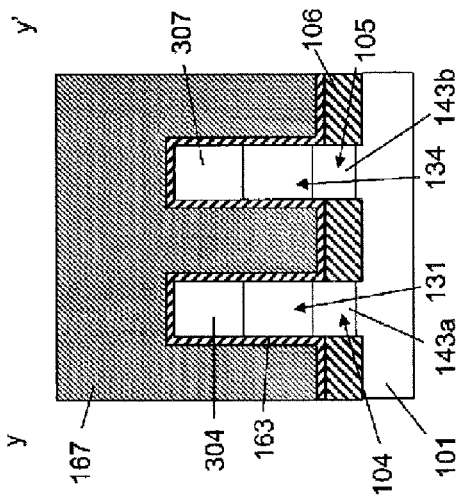
FIG. 32A is a plan view related to the method for producing a memory device according to the present invention.
Figure 32B:
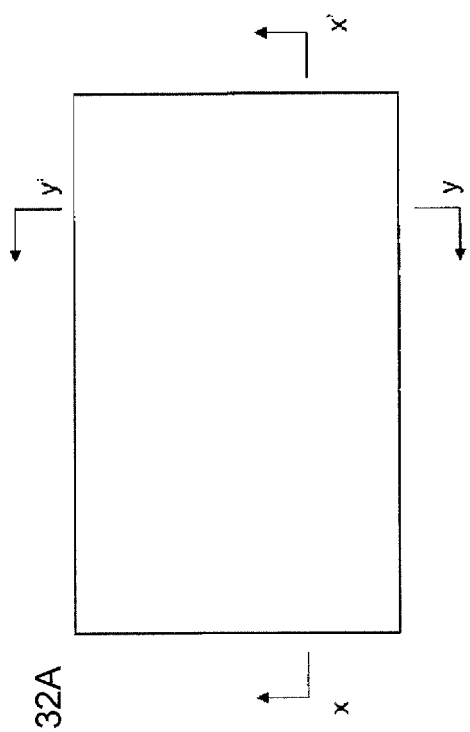
FIG. 32B is a cross-sectional view taken along line x-x' in FIG. 32A.
Figure 32C:
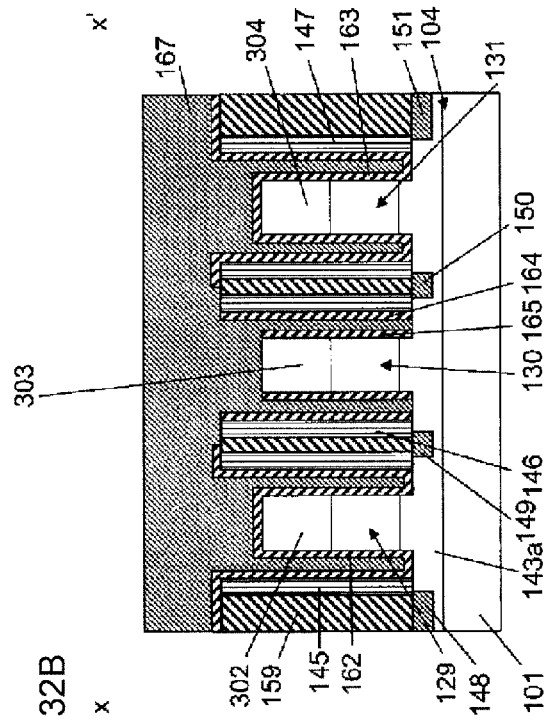
FIG. 32C is a cross-sectional view taken along line y-y' in FIG. 32A.

Referring to FIGS. 32A to 32C, a metal 167 is deposited.

Referring to FIGS. 33A to 33C, the metal 167 is etched back to form gate electrodes 168a and 170a and gate lines 168b and 170b around the first pillar-shaped silicon layers 129, 131, 132, and 134 and form a contact electrode 169a and a contact line 169b around the second pillar-shaped silicon layers 130 and 133.

The description up to this paragraph is the description of the fifth step following the fourth step, the fifth step including depositing and planarizing an interlayer insulating film, exposing upper portions of the first dummy gates, the second dummy gates, the third dummy gates, and the fourth dummy gates, removing the first dummy gates, the second dummy gates, the third dummy gates, and the fourth dummy gates, removing the second insulating film and the fourth insulating film, forming a gate insulating film around the first pillar-shaped semiconductor layers, around the second pillar-shaped semiconductor layers, and on an inner side of the fifth insulating film, forming a fourth resist for removing the gate insulating film around bottom portions of the second pillar-shaped semiconductor layers, removing the gate insulating film around the bottom portions of the second pillar-shaped semiconductor layers, depositing a metal, and etching back the metal so as to form gate electrodes and gate lines around the first pillar-shaped semiconductor layers and form contact electrodes and a contact line around the second pillar-shaped semiconductor layers.

Next, a sixth step following the fifth step is described. The sixth step includes forming pillar-shaped phase change layers and lower electrodes in two or more rows and two or more columns, forming a reset gate insulating film that surrounds the pillar-shaped phase change layers and the lower electrodes, and forming a reset gate that surrounds the pillar-shaped phase change layers in two or more rows and two or more columns.

Referring to FIGS. 34A to 34C, a second interlayer insulating film 171 is deposited.

Figure 35A:
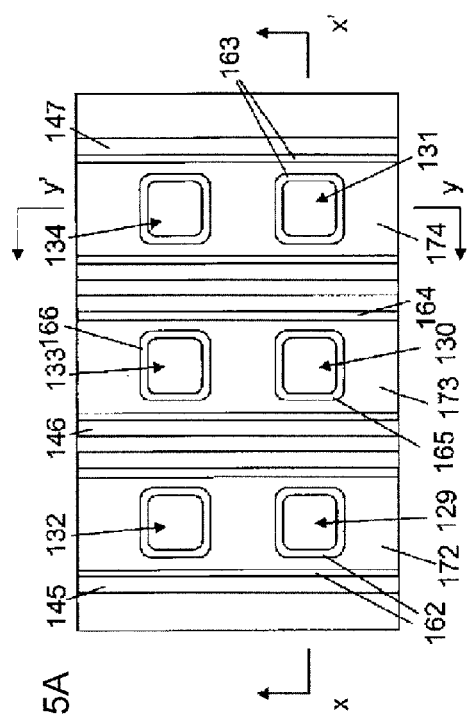
FIG. 35A is a plan view related to the method for producing a memory device according to the present invention.
Figure 35B:
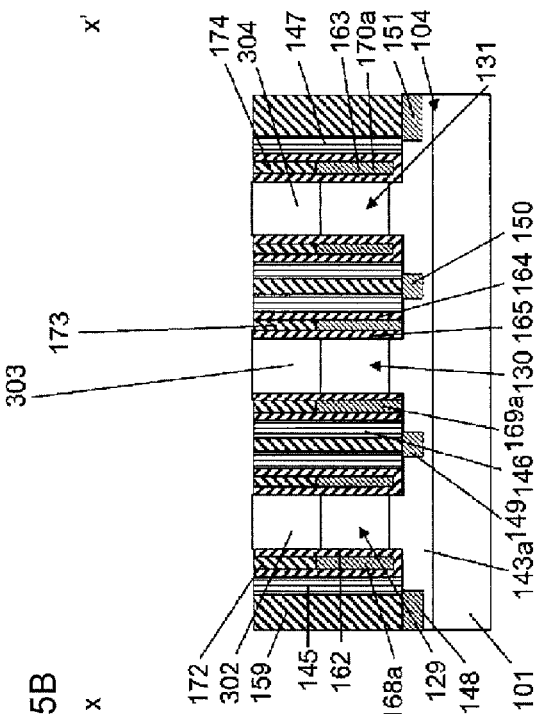
FIG. 35B is a cross-sectional view taken along line x-x' in FIG. 35A.
Figure 35C:
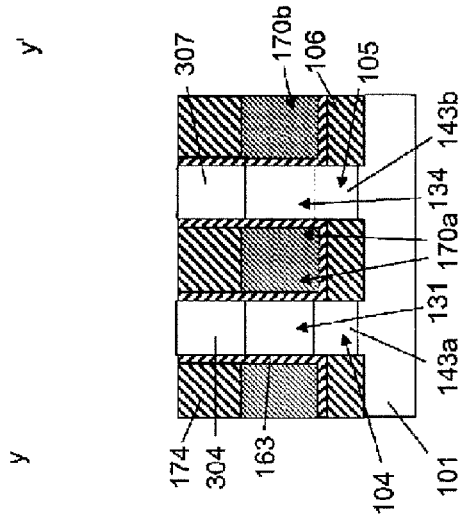
FIG. 35C is a cross-sectional view taken along line y-y' in FIG. 35A.

Referring to FIGS. 35A to 35C, the second interlayer insulating film 171 is etched back to expose upper portions of the first pillar-shaped silicon layers 129, 131, 132, and 134 and upper portions of the second pillar-shaped silicon layers 130 and 133.

Referring to FIGS. 36A to 36C, a metal 175 for forming lower electrodes, a film 176 with variable resistance, and a nitride film 177 are deposited.

Referring to FIGS. 37A to 37C, fifth resists 178, 179, 180, and 181 for forming pillar-shaped phase change layers and lower electrodes are formed.

Figure 38C:
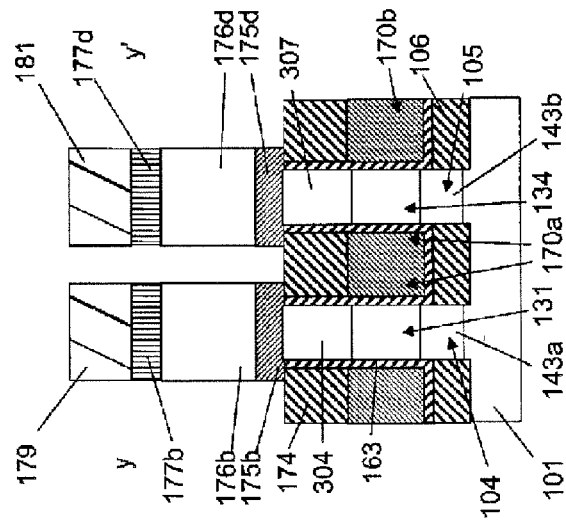
FIG. 38C is a cross-sectional view taken along line y-y' in FIG. 38A.
Figure 38A:
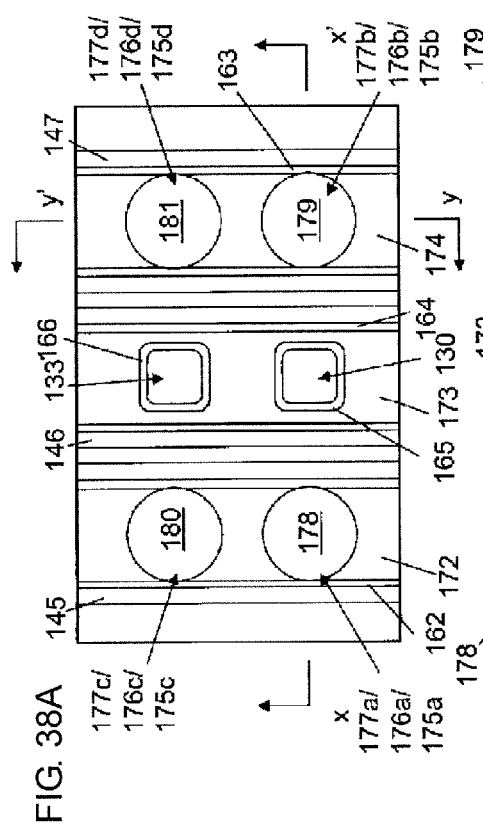
FIG. 38A is a plan view related to the method for producing a memory device according to the present invention.
Figure 38B:
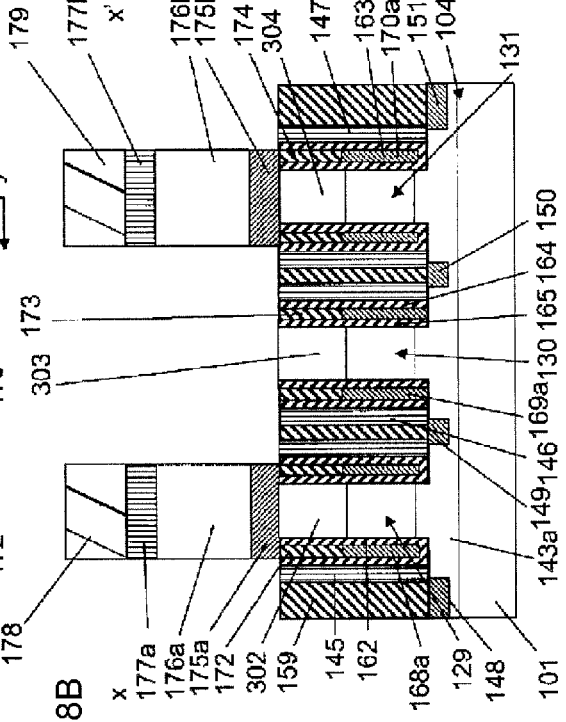
FIG. 38B is a cross-sectional view taken along line x-x' in FIG. 38A.

Referring to FIGS. 38A to 38C, the nitride film 177, the film 176 with variable resistance, and the metal 175 are etched. The nitride film 177 is divided into nitride films 177a, 177b, 177c, and 177d. The film 176 with variable resistance is divided into pillar-shaped phase change layers 176a, 176b, 176c, and 176d. The metal 175 is divided into lower electrodes 175a, 175b, 175c, and 175d.

Figure 39C:
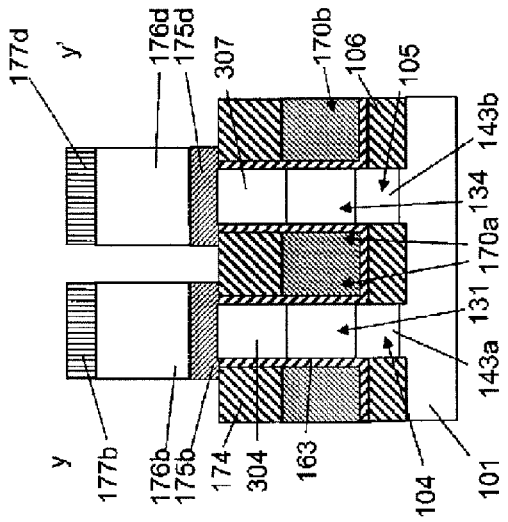
FIG. 39C is a cross-sectional view taken along line y-y' in FIG. 39A.
Figure 39A:
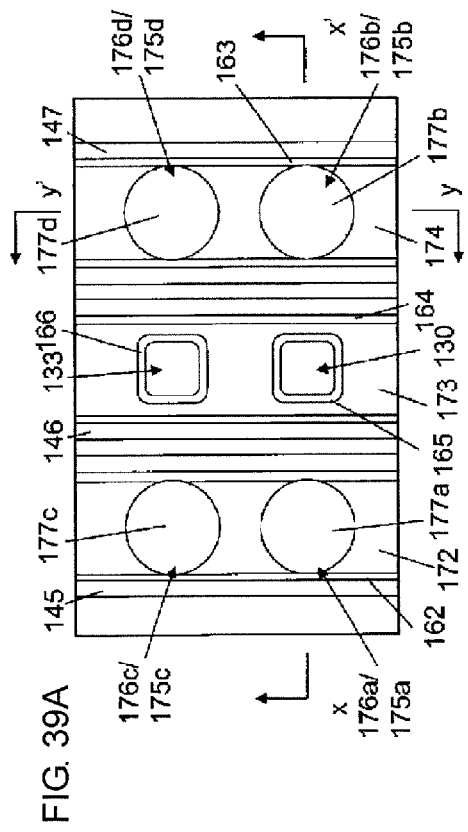
FIG. 39A is a plan view related to the method for producing a memory device according to the present invention.
Figure 39B:
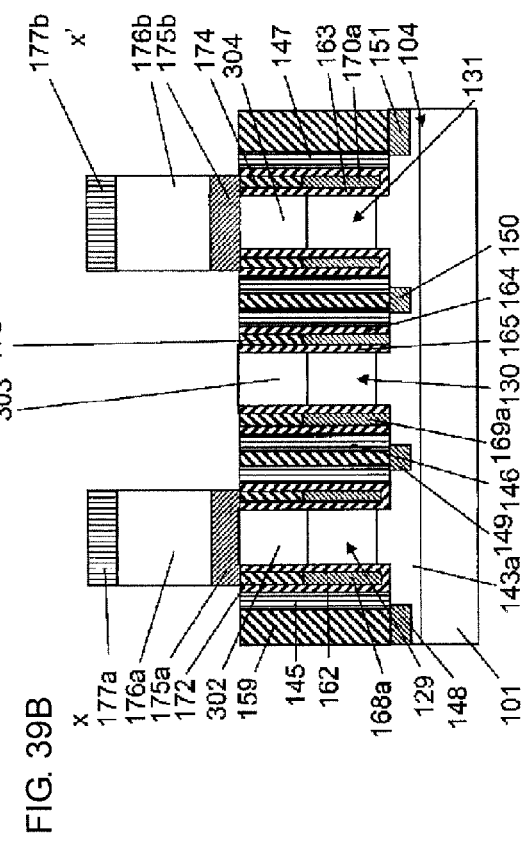
FIG. 39B is a cross-sectional view taken along line x-x' in FIG. 39A.

Referring to FIGS. 39A to 39C, the fifth resists 178, 179, 180, and 181 are removed.

Figure 40A:
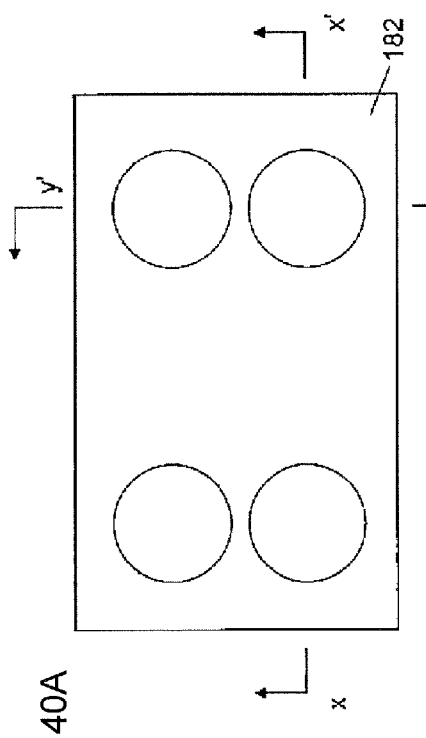
FIG. 40A is a plan view related to the method for producing a memory device according to the present invention.
Figure 40C:
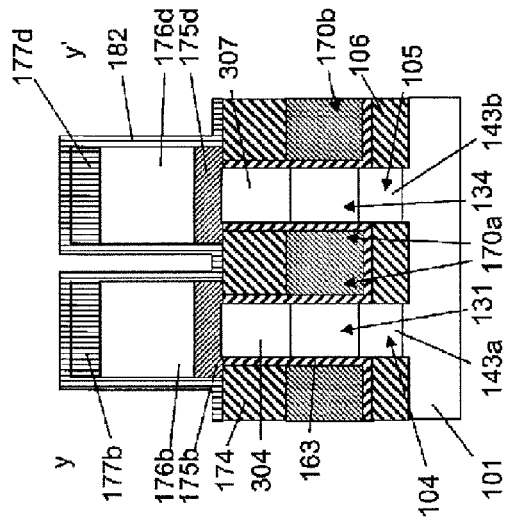
FIG. 40C is a cross-sectional view taken along line y-y' in FIG. 40A.
Figure 40B:
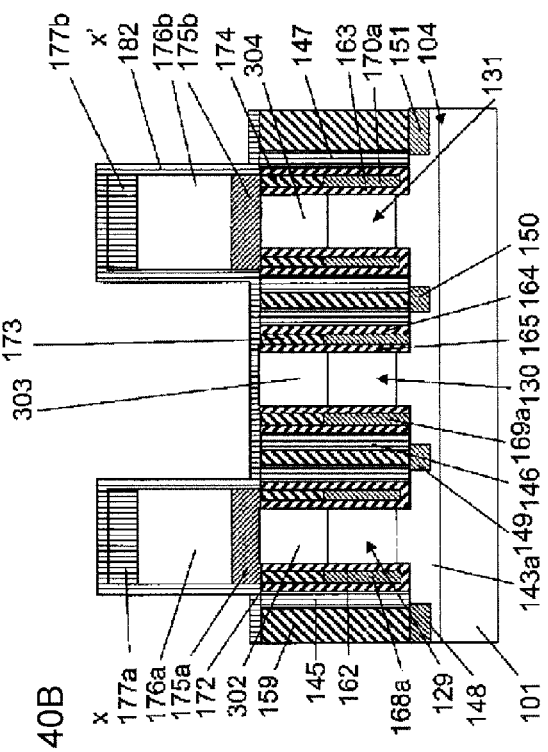
FIG. 40B is a cross-sectional view taken along line x-x' in FIG. 40A.

Referring to FIGS. 40A to 40C, a reset gate insulating film 182 is deposited.

Referring to FIGS. 41A to 41C, a metal 183 for forming a reset gate is deposited.

Figure 42A:
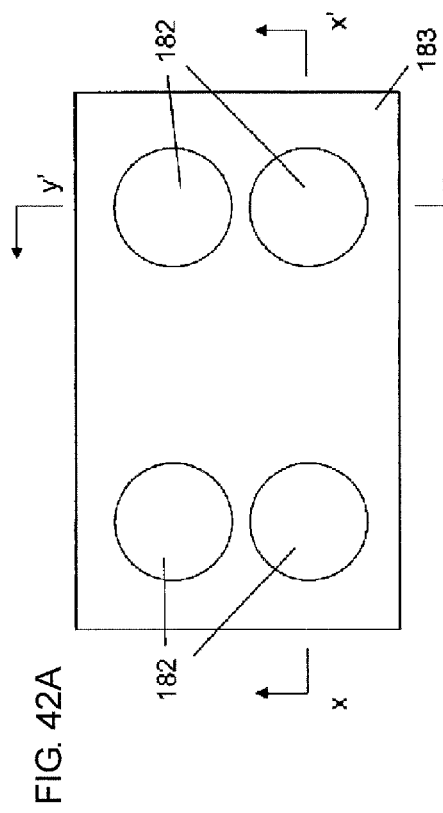
FIG. 42A is a plan view related to the method for producing a memory device according to the present invention.
Figure 42B:
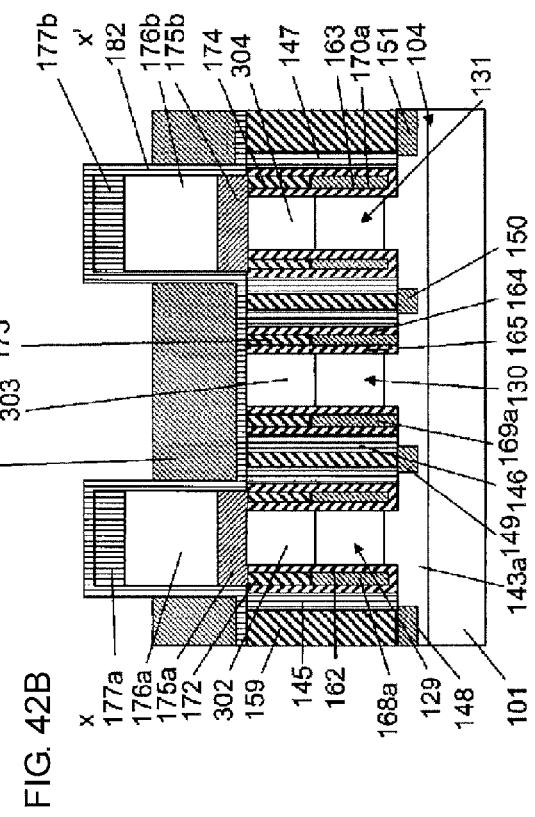
FIG. 42B is a cross-sectional view taken along line x-x' in FIG. 42A.
Figure 42C:
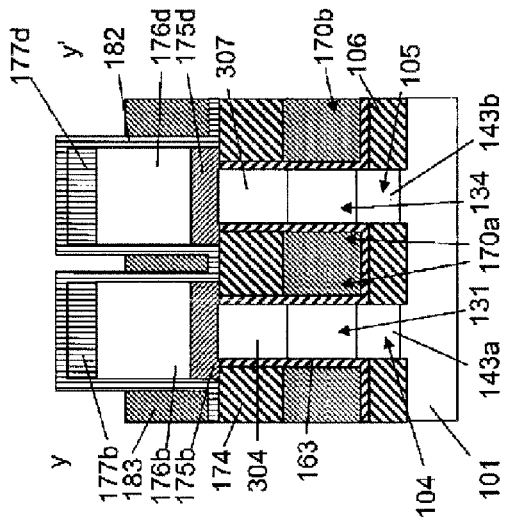
FIG. 42C is a cross-sectional view taken along line y-y' in FIG. 42A.

Referring to FIGS. 42A to 42C, the metal 183 is etched back.

Figure 43C:
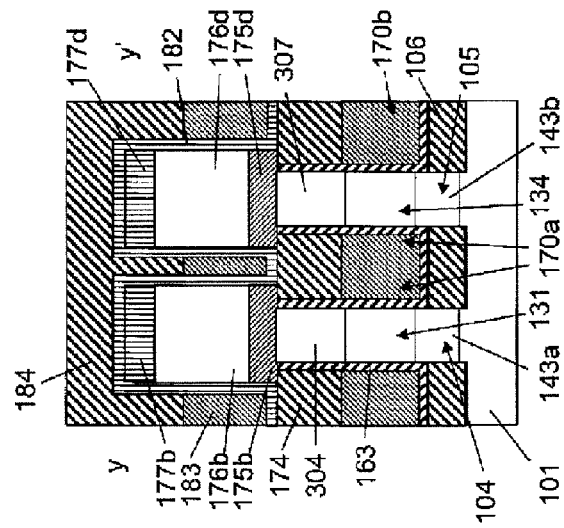
FIG. 43C is a cross-sectional view taken along line y-y' in FIG. 43A.
Figure 43A:
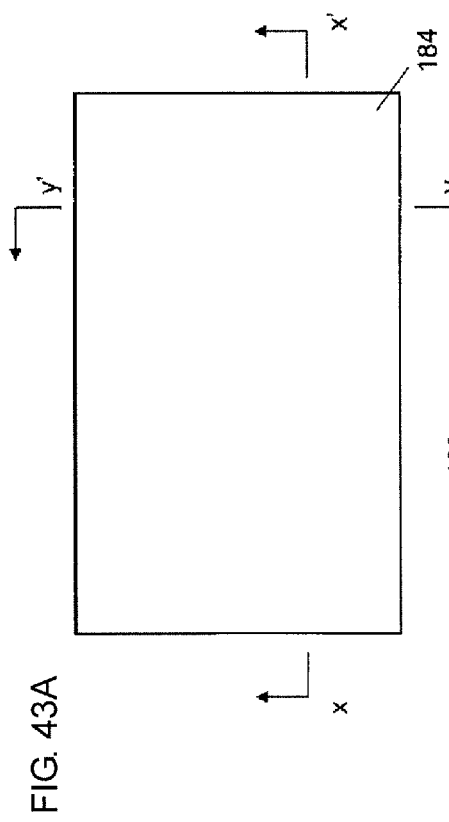
FIG. 43A is a plan view related to the method for producing a memory device according to the present invention.
Figure 43B:
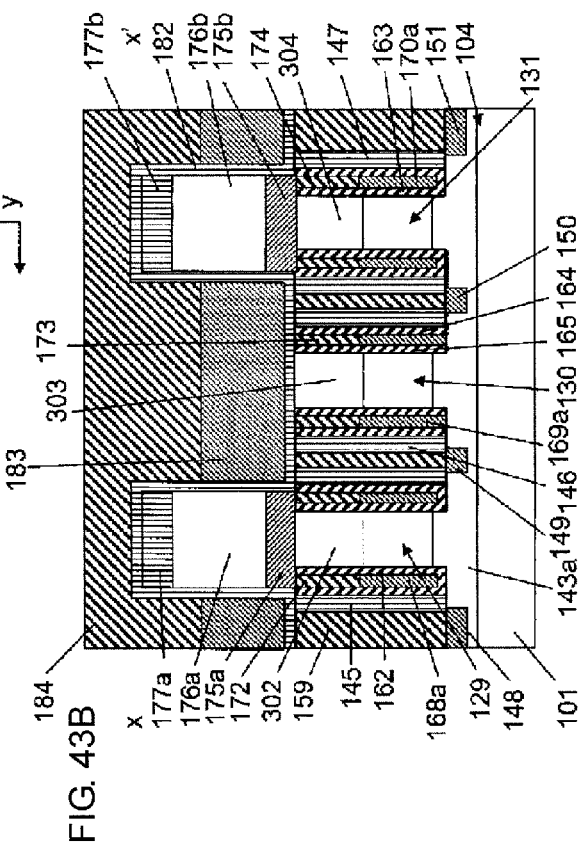
FIG. 43B is a cross-sectional view taken along line x-x' in FIG. 43A.

Referring to FIGS. 43A to 43C, a third interlayer insulating film 184 is deposited.

Referring to FIGS. 44A to 44C, the third interlayer insulating film 184 is planarized, the nitride films 177a, 177b, 177c, and 177d are removed, and upper portions of the pillar-shaped phase change layers 176a, 176b, 176c, and 176d are exposed.

Figure 45C:
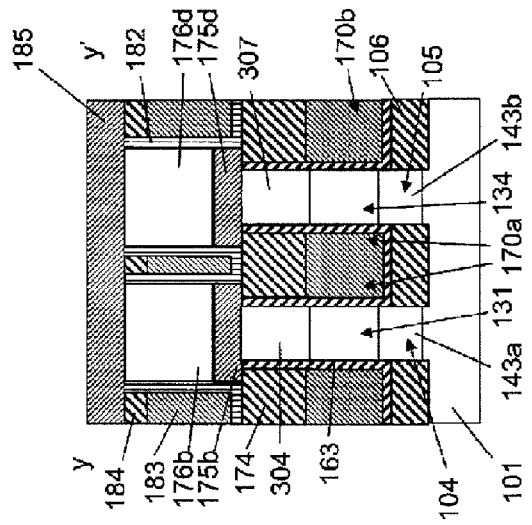
FIG. 45C is a cross-sectional view taken along line y-y' in FIG. 45A.
Figure 45A:
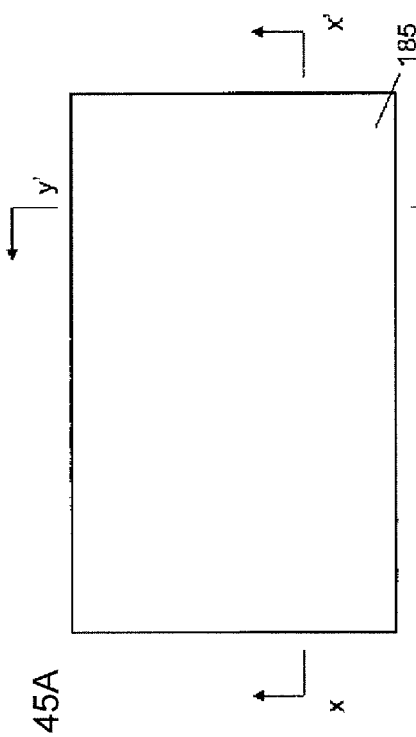
FIG. 45A is a plan view related to the method for producing a memory device according to the present invention.
Figure 45B:
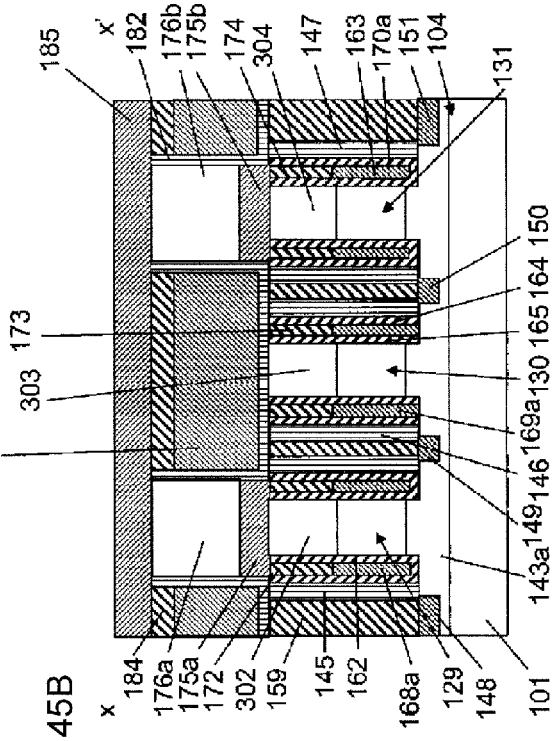
FIG. 45B is a cross-sectional view taken along line x-x' in FIG. 45A.

Referring to FIGS. 45A to 45C, a metal 185 is deposited.

Figure 46A:
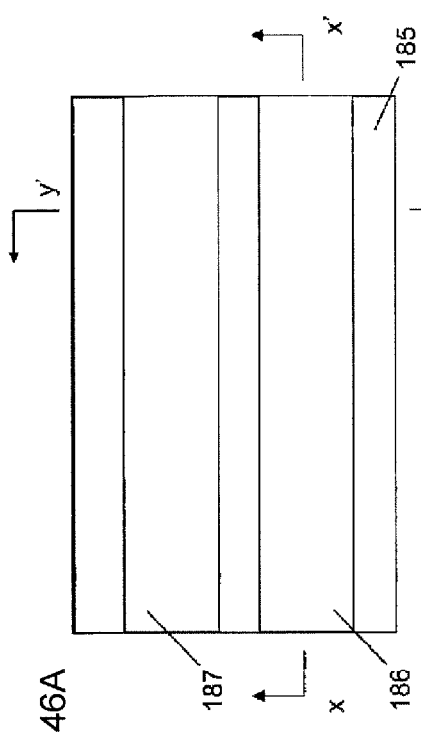
FIG. 46A is a plan view related to the method for producing a memory device according to the present invention.
Figure 46C:
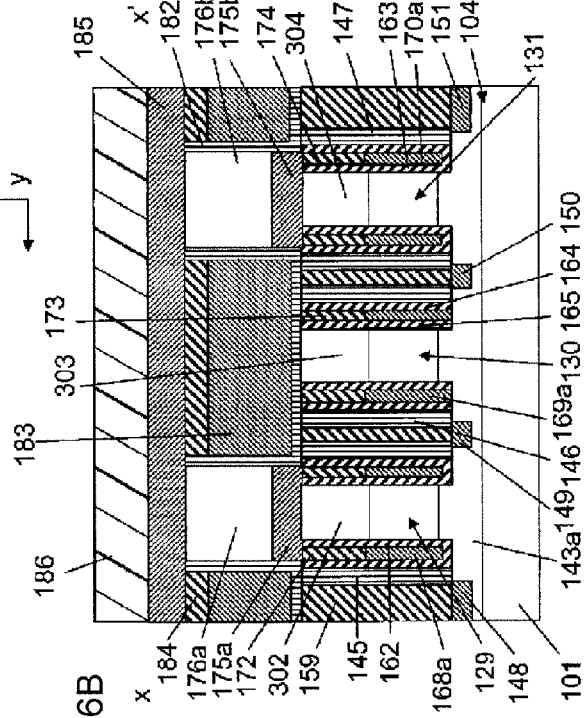
FIG. 46C is a cross-sectional view taken along line y-y' in FIG. 46A.
Figure 46B:
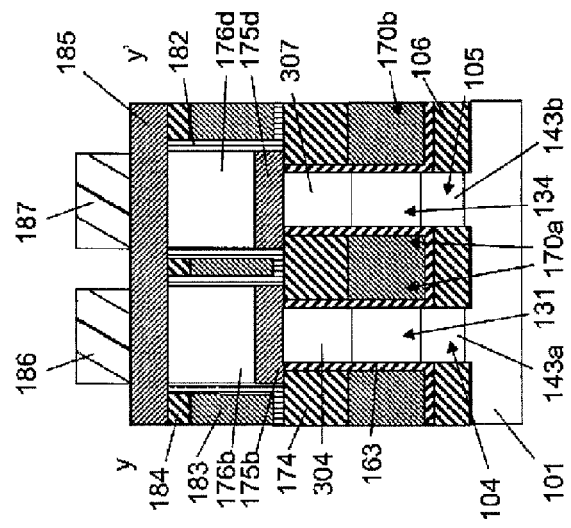
FIG. 46B is a cross-sectional view taken along line x-x' in FIG. 46A.

Referring to FIGS. 46A, to 46C, sixth resists 186 and 187 for forming bit lines are formed.

Figure 47A:
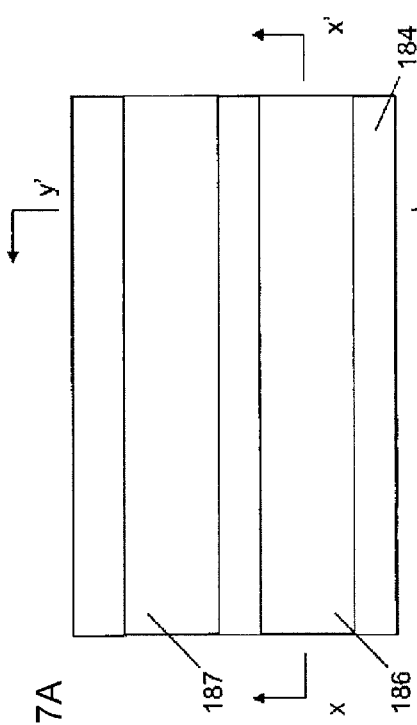
FIG. 47A is a plan view related to the method for producing a memory device according to the present invention.
Figure 47C:
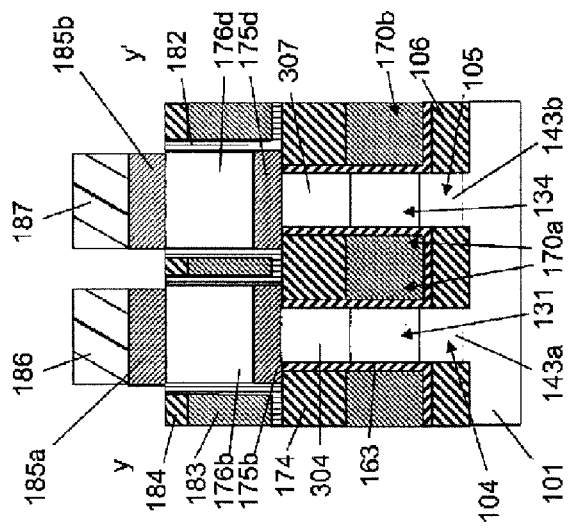
FIG. 47C is a cross-sectional view taken along line y-y' in FIG. 47A.
Figure 47B:
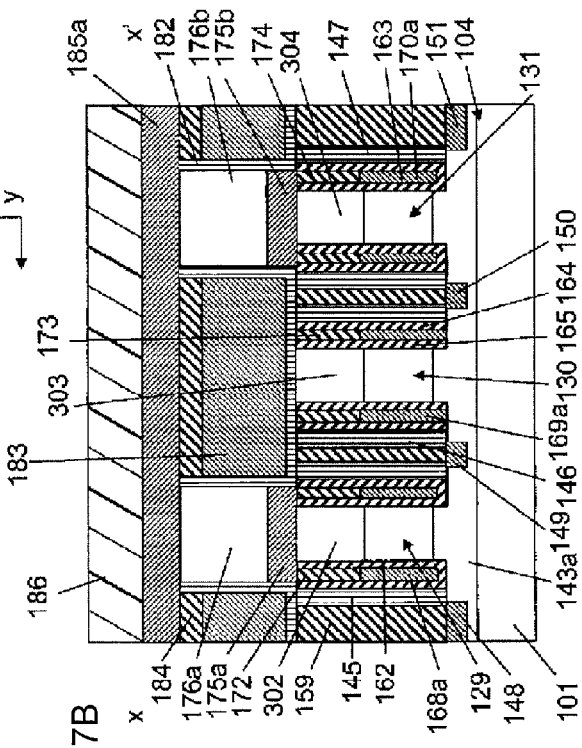
FIG. 47B is a cross-sectional view taken along line x-x' in FIG. 47A.

Referring to FIGS. 47A to 47C, the metal 185 is etched to form bit lines 185a and 185b.

Figure 48C:
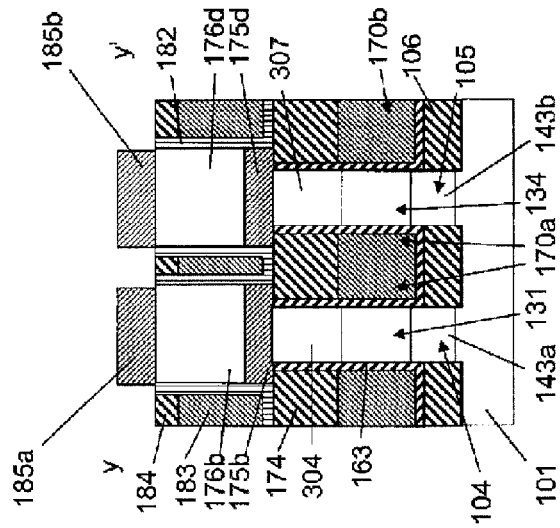
FIG. 48C is a cross-sectional view taken along line y-y' in FIG. 48A.
Figure 48A:
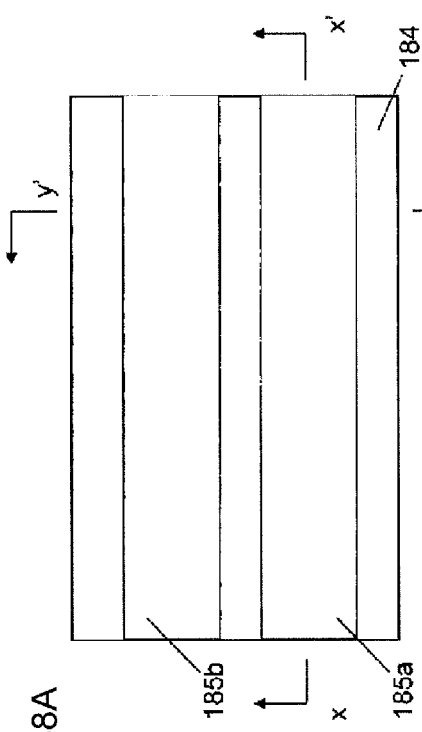
FIG. 48A is a plan view related to the method for producing a memory device according to the present invention.
Figure 48B:
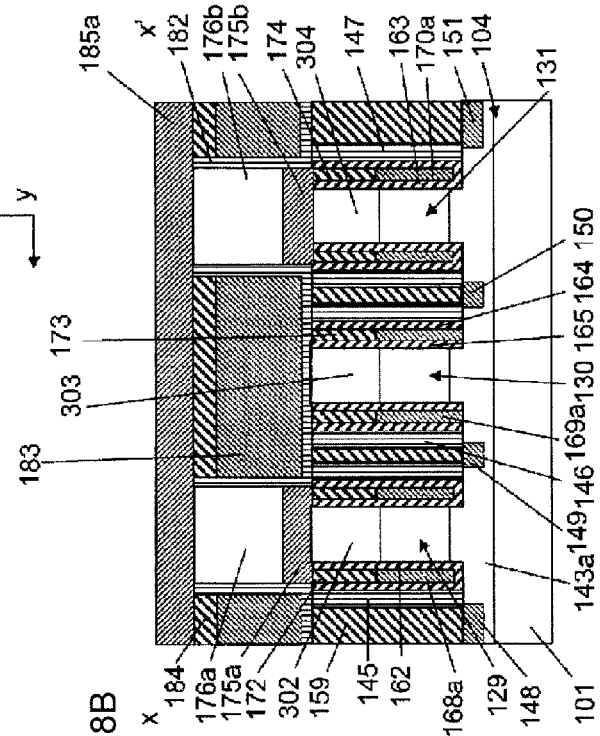
FIG. 48B is a cross-sectional view taken along line x-x' in FIG. 48A.

Referring to FIGS. 48A to 48C, the sixth resists 186 and 187 are removed.

The description up to this paragraph is the description of the sixth step that includes forming pillar-shaped phase change layers and lower electrodes in two or more rows and two or more columns, forming a reset gate insulating film that surrounds the pillar-shaped phase change layers and the lower electrodes, and forming a reset gate that surrounds the pillar-shaped phase change layers in two or more rows and two or more columns.

The steps for producing a memory device structure according to an embodiment of the present invention are as described in the above paragraphs.

The present invention can be implemented through various other embodiments and modifications without departing from the broad spirit and scope of the present invention. The embodiments described above are merely illustrative and do not limit the scope of the present invention.

For example, the above-described embodiments also cover a method for producing a semiconductor device in which the conductivity type (for example, p-type or p$^+$-type and n-type or n$^+$-type) is reversed, and a semiconductor device obtained by such a method, which naturally fall within the scope of the present invention.

What is claimed is:

1. A memory device comprising:
   a plurality of memory elements arranged in two or more rows and two or more columns, the memory elements each comprising:
      a pillar-shaped phase change layer,
      a reset gate insulating film surrounding the pillar-shaped phase change layer, and
      a reset gate surrounding the reset gate insulating film,
   wherein the reset gates extend in a lateral direction away from the pillar-shaped phase change layer and are directly connected in a row direction and in a column direction, and comprise heaters, and
   the pillar-shaped phase change layers are electrically insulated from the reset gates.

2. The memory device according to claim 1 further comprising a lower electrode under the pillar-shaped phase change layer.

3. The memory device according to claim 1, wherein the reset gate comprises titanium nitride.

4. The memory device according to claim 1, wherein the reset gate insulating film comprises a nitride film.

5. The memory device according to claim 2, wherein the lower electrode comprises titanium nitride.

6. The memory device according to claim 1, wherein the phase change layer is configured to be reset by supplying an electric current to the reset gate.

7. A memory device comprising:
   first pillar-shaped semiconductor layers,
   gate insulating films around the first pillar-shaped semiconductor layers,
   gate electrodes around the gate insulating films,
   gate lines connected to the gate electrodes,
   first diffusion layers in upper portions of the first pillar-shaped semiconductor layers,
   second diffusion layers in lower portions of the first pillar-shaped semiconductor layers, and
   a plurality of memory elements arranged in two or more rows and two or more columns and on the first diffusion layers, each memory element comprising a pillar-shaped phase change layer, a reset gate insulating film surrounding the pillar-shaped phase change layer, and a reset gate surrounding the reset gate insulating film,
   wherein the reset gates extend in a lateral direction away from the pillar-shaped phase change layer and are connected in a row direction and in a column direction, and comprise heaters, and
   the pillar-shaped phase change layers are electrically insulated from the reset gates.

8. The memory device according to claim 7 further comprising a lower electrode under the pillar-shaped phase change layer.

9. The memory device according to claim 7, wherein the reset gate comprises titanium nitride.

10. The memory device according to claim 7, wherein the reset gate insulating film comprises a nitride film.

11. The memory device according to claim 8, wherein the lower electrode comprises titanium nitride.

12. The memory device according to claim 7, wherein the phase change layer is configured to be reset by supplying an electric current to the reset gate.

13. The memory device according to claim 7, wherein the first pillar-shaped semiconductor layers are on fin-shaped semiconductor layers that is on a semiconductor substrate and are surrounded by a first insulating film, the gate insulating films are around and at bottoms of the gate electrodes and the gate lines, the gate electrodes comprise a metal, the gate lines comprises a metal, the gate lines extend in a direction perpendicular to a direction in which the fin-shaped semiconductor layers extend, and the second diffusion layers are in the fin-shaped semiconductor layers.

14. The memory device according to claim 13, wherein the second diffusion layers are also in the semiconductor substrate.

15. The memory device according to claim 13, further comprising a contact line parallel to the gate lines and connected to the second diffusion layers.

16. The memory device according to claim 15, further comprising:
second pillar-shaped semiconductor layers on the fin-shaped semiconductor layers; and
contact electrodes comprising a metal around the second pillar-shaped semiconductor layers,
wherein the contact line comprises a metal extending in the direction perpendicular to the direction in which the fin-shaped semiconductor layers extend, and is connected to the contact electrodes,
the second diffusion layers are in the fin-shaped semiconductor layers and lower portions of the second pillar-shaped semiconductor layers, and
the contact electrodes are connected to the second diffusion layers.

17. The memory device according to claim 13, wherein an outer width of the gate electrodes is equal to a width of the gate lines, and a width of the first pillar-shaped semiconductor layers in the direction perpendicular to the direction in which the fin-shaped semiconductor layers extend is equal to a width of the fin-shaped semiconductor layers in the direction perpendicular to the direction in which the fin-shaped semiconductor layers extend.

18. The memory device according to claim 16, wherein the gate insulating films are between the second pillar-shaped semiconductor layers and the contact electrodes.

19. The memory device according to claim 16, wherein a width of the second pillar-shaped semiconductor layers in the direction perpendicular to the direction in which the fin-shaped semiconductor layers extend is equal to a width of the fin-shaped semiconductor layers in the direction perpendicular to the direction in which the fin-shaped semiconductor layers extend.

20. The memory device according to claim 18, wherein the gate insulating films are around the contact electrodes and the contact line.

21. The memory device according to claim 16, wherein an outer width of the contact electrodes is equal to a width of the contact line.

22. The memory device according to claim 7, wherein the first pillar-shaped semiconductor layers are on a semiconductor substrate, the gate insulating films are around and at bottoms of the gate electrodes and the gate lines, and the gate electrodes comprise a metal, the gate lines comprise a metal, and the second diffusion layers are also in the semiconductor substrate.

* * * * *